US010790280B2

(12) United States Patent
Ching et al.

(10) Patent No.: US 10,790,280 B2
(45) Date of Patent: Sep. 29, 2020

(54) MULTI-GATE DEVICE AND METHOD OF FABRICATION THEREOF

(71) Applicant: Taiwan Semiconductor Manufacturing Company, Ltd., Hsin-Chu (TW)

(72) Inventors: Kuo-Cheng Ching, Hsinchu County (TW); Chung-Cheng Wu, Hsin-Chu County (TW); Ching-Fang Huang, Taipei (TW); Wen-Hsing Hsieh, Hsinchu (TW); Ying-Keung Leung, Hsin-Chu (TW); Cheng-Ting Chung, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/887,347

(22) Filed: Feb. 2, 2018

(65) Prior Publication Data

US 2018/0175036 A1 Jun. 21, 2018

Related U.S. Application Data

(62) Division of application No. 14/941,745, filed on Nov. 16, 2015, now Pat. No. 9,899,387.

(51) Int. Cl.
*H01L 29/66* (2006.01)
*H01L 29/06* (2006.01)
(Continued)

(52) U.S. Cl.
CPC .... *H01L 27/0922* (2013.01); *H01L 21/82385* (2013.01); *H01L 21/823431* (2013.01);
(Continued)

(58) Field of Classification Search
CPC ........... H01L 29/1054; H01L 29/66795; H01L 29/785; H01L 29/42392; H01L 29/66545;
(Continued)

(56) References Cited

U.S. PATENT DOCUMENTS 7,002,207 B2 * 2/2006 Kim ................ H01L 21/823412
257/331
7,074,657 B2 * 7/2006 Pan ................... H01L 29/78639
257/E29.284

(Continued)

*Primary Examiner* — Sophia T Nguyen
(74) *Attorney, Agent, or Firm* — Haynes and Boone, LLP

(57) ABSTRACT

A semiconductor includes a first transistor and a second transistor. The first transistor includes a first and a second epitaxial layer, formed of a first semiconductor material. The second epitaxial layer is disposed over the first epitaxial layer. The first transistor also includes a first gate dielectric layer surrounds the first and second epitaxial layers and extends from a top surface of the first epitaxial layer to a bottom surface of the second epitaxial layer and a first metal gate layer surrounding the first gate dielectric layer. The second transistor includes a third epitaxial layer formed of the first semiconductor material and a fourth epitaxial layer disposed directly on the third epitaxial layer and formed of a second semiconductor. The second transistor also includes a second gate dielectric layer disposed over the third and fourth epitaxial layers and a second metal gate layer disposed over the second gate dielectric layer.

20 Claims, 19 Drawing Sheets

(51) Int. Cl.

| | | |
|---|---|---|
| *H01L 29/786* | (2006.01) | |
| *H01L 29/78* | (2006.01) | |
| *H01L 27/092* | (2006.01) | |
| *H01L 21/8238* | (2006.01) | |
| *H01L 29/10* | (2006.01) | |
| *H01L 29/423* | (2006.01) | |
| *H01L 21/8234* | (2006.01) | |
| *H01L 21/762* | (2006.01) | |

(52) U.S. Cl.
CPC ........... *H01L 21/823807* (2013.01); *H01L 21/823814* (2013.01); *H01L 21/823821* (2013.01); *H01L 27/0924* (2013.01); *H01L 29/0653* (2013.01); *H01L 29/1054* (2013.01); *H01L 29/42392* (2013.01); *H01L 29/66545* (2013.01); *H01L 29/785* (2013.01); *H01L 29/78696* (2013.01); *H01L 21/76224* (2013.01); *H01L 21/823878* (2013.01); *H01L 27/092* (2013.01)

(58) Field of Classification Search
CPC ........... H01L 27/0924; H01L 27/0922; H01L 21/823821; H01L 21/82385; H01L 21/823814; H01L 29/0653; H01L 29/0847; H01L 29/78696; H01L 29/0673; H01L 29/66439; H01L 29/775
See application file for complete search history.

(56) References Cited

U.S. PATENT DOCUMENTS

| | | | |
|---|---|---|---|
| 7,667,271 B2 | 2/2010 | Yu et al. | |
| 7,821,061 B2* | 10/2010 | Jin | B82Y 10/00 257/331 |
| 7,910,453 B2 | 3/2011 | Xu et al. | |
| 8,008,751 B2* | 8/2011 | Irisawa | H01L 21/84 257/347 |
| 8,071,983 B2* | 12/2011 | Brask | H01L 21/30608 257/66 |
| 8,216,902 B2 | 7/2012 | Chang et al. | |
| 8,377,779 B1 | 2/2013 | Wang | |
| 8,399,931 B2 | 3/2013 | Liaw et al. | |
| 8,580,624 B2* | 11/2013 | Bangsaruntip | B82Y 10/00 257/351 |
| 8,652,894 B2 | 2/2014 | Lin et al. | |
| 8,679,902 B1 | 3/2014 | Basker et al. | |
| 8,686,516 B2 | 4/2014 | Chen et al. | |
| 8,709,888 B2* | 4/2014 | Chang | B82Y 10/00 257/288 |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,748,940 B1 | 6/2014 | Rachmady et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,872,161 B1 | 10/2014 | Ching et al. | |
| 8,969,149 B2 | 3/2015 | Leobandung | |
| 9,099,388 B2 | 8/2015 | Lin et al. | |
| 9,219,064 B2* | 12/2015 | Kim | H01L 27/092 |
| 9,230,989 B2* | 1/2016 | Chang | B82Y 10/00 |
| 9,263,338 B2* | 2/2016 | Liu | H01L 21/823487 |
| 9,276,064 B1 | 3/2016 | Zang et al. | |
| 9,306,019 B2* | 4/2016 | Wan | H01L 29/42392 |
| 9,343,559 B2 | 5/2016 | Glass et al. | |
| 9,385,218 B1 | 7/2016 | Cheng et al. | |
| 9,437,502 B1 | 9/2016 | Cheng et al. | |
| 9,437,691 B2 | 9/2016 | Glass et al. | |
| 9,466,601 B2* | 10/2016 | Yang | H01L 27/0922 |
| 9,508,712 B2* | 11/2016 | Wahl | H01L 27/088 |
| 9,576,856 B2* | 2/2017 | Zang | H01L 21/823807 |
| 9,590,038 B1* | 3/2017 | Kim | H01L 29/42392 |
| 9,601,569 B1* | 3/2017 | Suk | H01L 29/0673 |
| 9,613,871 B2* | 4/2017 | Suk | H01L 27/092 |
| 9,620,590 B1 | 4/2017 | Bergendahl et al. | |
| 9,627,540 B1 | 4/2017 | Chen et al. | |
| 9,660,028 B1 | 5/2017 | Cheng et al. | |
| 9,673,279 B2 | 6/2017 | Lee et al. | |
| 9,728,621 B1* | 8/2017 | Cheng | H01L 29/4983 |
| 9,818,872 B2 | 11/2017 | Ching et al. | |
| 9,842,835 B1* | 12/2017 | Cheng | H01L 27/0629 |
| 9,923,055 B1* | 3/2018 | Cheng | H01L 29/0665 |
| 9,923,058 B2* | 3/2018 | Suk | H01L 29/1054 |
| 9,929,235 B1* | 3/2018 | Yang | H01L 21/823807 |
| 9,991,254 B1* | 6/2018 | Cheng | H01L 21/02532 |
| 10,002,939 B1* | 6/2018 | Cheng | H01L 29/0649 |
| 10,008,575 B2* | 6/2018 | Suh | H01L 23/5283 |
| 10,103,065 B1* | 10/2018 | Mochizuki | H01L 21/823842 |
| 10,128,122 B2* | 11/2018 | Bi | H01L 29/66545 |
| 10,141,403 B1* | 11/2018 | Cheng | H01L 29/0603 |
| 10,157,799 B2* | 12/2018 | Ching | H01L 21/823821 |
| 10,181,510 B2* | 1/2019 | Yang | H01L 29/0673 |
| 10,243,040 B1* | 3/2019 | Park | H01L 29/0642 |
| 10,269,790 B2* | 4/2019 | Cheng | H01L 21/02532 |
| 10,355,137 B2* | 7/2019 | Ching | H01L 29/66439 |
| 2002/0180991 A1 | 12/2002 | Takoudis et al. | |
| 2005/0139231 A1 | 6/2005 | Abadie et al. | |
| 2006/0024874 A1* | 2/2006 | Yun | H01L 29/42392 438/197 |
| 2006/0216897 A1* | 9/2006 | Lee | B82Y 10/00 438/282 |
| 2007/0111474 A1 | 5/2007 | Delattre et al. | |
| 2009/0085119 A1* | 4/2009 | Ernst | H01L 29/66439 257/365 |
| 2009/0283907 A1 | 11/2009 | Goswami et al. | |
| 2010/0140746 A1 | 6/2010 | Radouane et al. | |
| 2012/0007052 A1 | 1/2012 | Hobbs et al. | |
| 2012/0007167 A1 | 1/2012 | Hung et al. | |
| 2012/0138886 A1 | 6/2012 | Kuhn et al. | |
| 2012/0139007 A1* | 6/2012 | Tatsumura | H01L 29/045 257/192 |
| 2013/0153997 A1 | 6/2013 | Chang et al. | |
| 2013/0248948 A1* | 9/2013 | Ma | H01L 29/66636 257/288 |
| 2013/0264639 A1 | 10/2013 | Glass et al. | |
| 2013/0264671 A1 | 10/2013 | Yun et al. | |
| 2013/0270512 A1* | 10/2013 | Radosavljevic | H01L 21/823821 257/9 |
| 2013/0277752 A1* | 10/2013 | Glass | H01L 21/823821 257/369 |
| 2013/0279145 A1 | 10/2013 | Then et al. | |
| 2013/0313513 A1 | 11/2013 | Cappellani et al. | |
| 2013/0320294 A1* | 12/2013 | Cappellani | H01L 29/66439 257/9 |
| 2013/0341596 A1* | 12/2013 | Chang | H01L 21/845 257/29 |
| 2013/0341704 A1* | 12/2013 | Rachmady | H01L 29/66545 257/327 |
| 2014/0001441 A1* | 1/2014 | Kim | H01L 29/0673 257/29 |
| 2014/0001520 A1 | 1/2014 | Glass et al. | |
| 2014/0001574 A1 | 1/2014 | Chen et al. | |
| 2014/0021538 A1 | 1/2014 | Bangsaruntip et al. | |
| 2014/0042386 A1* | 2/2014 | Cea | H01L 29/42392 257/9 |
| 2014/0054724 A1 | 2/2014 | Ching et al. | |
| 2014/0084239 A1 | 3/2014 | Radosavljevic et al. | |
| 2014/0091360 A1* | 4/2014 | Pillarisetty | H01L 29/7853 257/190 |
| 2014/0091361 A1* | 4/2014 | Goel | H01L 21/845 257/190 |
| 2014/0110755 A1 | 4/2014 | Colinge | |
| 2014/0131660 A1 | 5/2014 | Cea et al. | |
| 2014/0151812 A1 | 6/2014 | Liaw | |
| 2014/0175515 A1 | 6/2014 | Then et al. | |
| 2014/0197377 A1 | 7/2014 | Kim et al. | |

(56) References Cited

U.S. PATENT DOCUMENTS

| | | |
|---|---|---|
| 2014/0197458 A1 | 7/2014 | Ching et al. |
| 2014/0209855 A1 | 7/2014 | Cea et al. |
| 2014/0239255 A1* | 8/2014 | Kang ................ H01L 29/775 257/24 |
| 2014/0264280 A1 | 9/2014 | Kim et al. |
| 2014/0264604 A1 | 9/2014 | Tsai et al. |
| 2014/0273412 A1 | 9/2014 | Wu et al. |
| 2014/0339611 A1 | 11/2014 | Leobandung |
| 2014/0346497 A1 | 11/2014 | Hiramatsu et al. |
| 2014/0367741 A1* | 12/2014 | Yang ................ H01L 29/04 257/190 |
| 2014/0374797 A1* | 12/2014 | Kwon ................ H01L 29/1054 257/190 |
| 2015/0021691 A1 | 1/2015 | Akarvardar et al. |
| 2015/0021704 A1 | 1/2015 | Zang et al. |
| 2015/0021715 A1 | 1/2015 | Chang et al. |
| 2015/0041899 A1* | 2/2015 | Yang ................ H01L 27/0922 257/351 |
| 2015/0053928 A1* | 2/2015 | Ching ............ H01L 21/823821 257/29 |
| 2015/0069328 A1 | 3/2015 | Leobandung |
| 2015/0090958 A1* | 4/2015 | Yang ................ H01L 29/0676 257/27 |
| 2015/0104918 A1* | 4/2015 | Liu ................ H01L 29/42392 438/283 |
| 2015/0035071 A1 | 5/2015 | Ching et al. |
| 2015/0194489 A1 | 7/2015 | Barraud et al. |
| 2015/0194510 A1 | 7/2015 | Camillo-Castillo et al. |
| 2015/0214364 A1* | 7/2015 | Chan ................ H01L 29/785 257/190 |
| 2015/0228480 A1* | 8/2015 | Yin ................ H01L 29/00 438/283 |
| 2015/0236051 A1* | 8/2015 | Loubet ................ H01L 27/1211 257/347 |
| 2015/0236120 A1 | 8/2015 | Hashemi et al. |
| 2015/0243564 A1 | 8/2015 | Zhao |
| 2015/0340457 A1 | 11/2015 | Xie et al. |
| 2015/0340490 A1 | 11/2015 | An et al. |
| 2015/0357433 A1 | 12/2015 | Moll et al. |
| 2015/0372104 A1* | 12/2015 | Liu ................ H01L 29/42364 257/77 |
| 2015/0372145 A1 | 12/2015 | Cheng et al. |
| 2015/0380313 A1* | 12/2015 | Ching ............ H01L 21/823431 438/283 |
| 2016/0013309 A1* | 1/2016 | Bae ................ H01L 29/785 257/351 |
| 2016/0027870 A1* | 1/2016 | Cheng ................ H01L 29/0673 257/347 |
| 2016/0049516 A1 | 2/2016 | Huang et al. |
| 2016/0118480 A1 | 4/2016 | Xie et al. |
| 2016/0181352 A1* | 6/2016 | Cheng ................ H01L 28/60 257/532 |
| 2016/0190239 A1* | 6/2016 | Suk ................ H01L 29/0649 257/351 |
| 2016/0204131 A1* | 7/2016 | Cheng ................ H01L 27/1211 257/351 |
| 2016/0204263 A1* | 7/2016 | Mukherjee ................ H01L 29/42392 257/76 |
| 2016/0233317 A1* | 8/2016 | Yin ................ H01L 29/66439 |
| 2016/0240652 A1* | 8/2016 | Ching ................ H01L 29/41708 |
| 2016/0240681 A1* | 8/2016 | Ching ................ H01L 29/775 |
| 2016/0276344 A1 | 9/2016 | Choi et al. |
| 2016/0276484 A1* | 9/2016 | Kim ................ H01L 29/7851 |
| 2016/0293699 A1 | 10/2016 | Leobandung |
| 2016/0308032 A1* | 10/2016 | Glass ................ H01L 29/66795 |
| 2017/0005188 A1* | 1/2017 | Cheng ................ H01L 29/785 |
| 2017/0005190 A1 | 1/2017 | Chang et al. |
| 2017/0005195 A1* | 1/2017 | Ching ................ H01L 29/0673 |
| 2017/0025314 A1 | 1/2017 | Witters et al. |
| 2017/0033106 A1* | 2/2017 | Walke ................ H01L 21/823807 |
| 2017/0053998 A1* | 2/2017 | Kim ................ H01L 29/42392 |
| 2017/0062428 A1* | 3/2017 | Cheng ................ H01L 27/0924 |
| 2017/0069481 A1* | 3/2017 | Doris ................ H01L 21/0228 |
| 2017/0104061 A1* | 4/2017 | Peng ................ H01L 21/3081 |
| 2017/0133375 A1* | 5/2017 | Fung ................ H01L 21/823807 |
| 2017/0140996 A1* | 5/2017 | Lin ................ H01L 29/42392 |
| 2017/0141112 A1* | 5/2017 | Ching ................ H01L 27/0924 |
| 2017/0141212 A1* | 5/2017 | Barraud ................ H01L 21/02667 |
| 2017/0154958 A1 | 6/2017 | Fung et al. |
| 2017/0154973 A1 | 6/2017 | Ching et al. |
| 2017/0162447 A1* | 6/2017 | Glass ................ H01L 21/823821 |
| 2017/0194479 A1* | 7/2017 | Lee ................ H01L 29/785 |
| 2017/0213911 A1* | 7/2017 | Balakrishnan ................ H01L 29/778 |
| 2018/0138289 A1* | 5/2018 | Rachmady ................ H01L 29/66545 |
| 2018/0166535 A1* | 6/2018 | Wostyn ................ H01L 29/42392 |
| 2018/0182893 A1* | 6/2018 | Coquand ................ H01L 29/7847 |
| 2018/0226490 A1* | 8/2018 | Le ................ B82Y 10/00 |
| 2018/0254321 A1* | 9/2018 | Wostyn ................ H01L 29/0653 |
| 2019/0131274 A1* | 5/2019 | Wu ................ H01L 29/42392 |
| 2019/0189739 A1* | 6/2019 | Li ................ H01L 29/42392 |
| 2019/0198645 A1* | 6/2019 | Cheng ................ H01L 29/78618 |

* cited by examiner

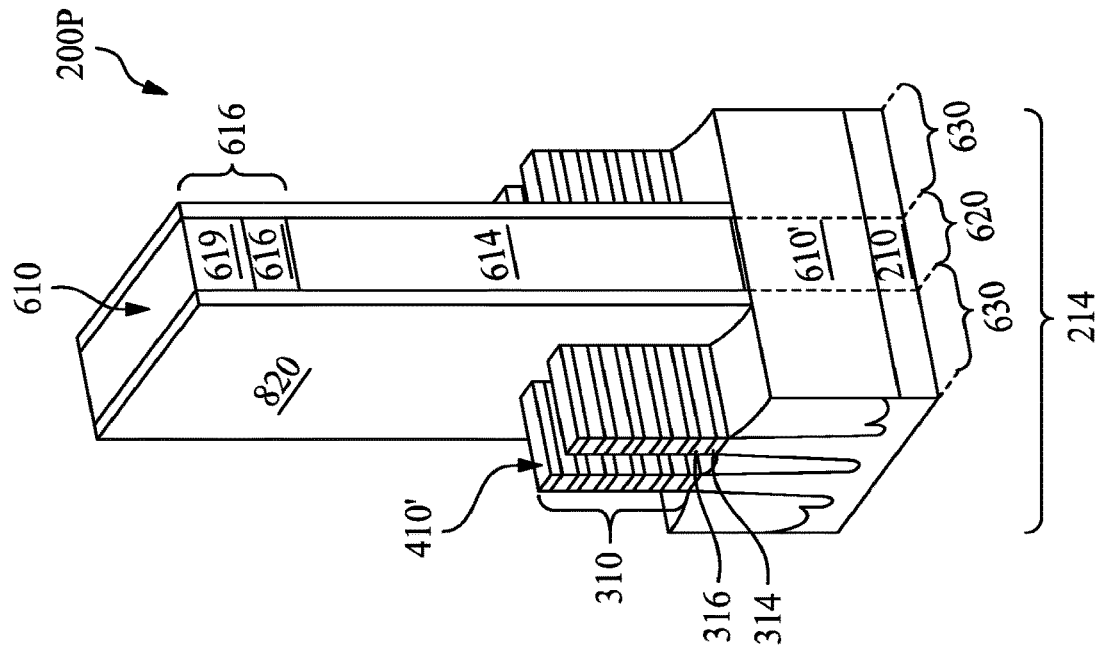
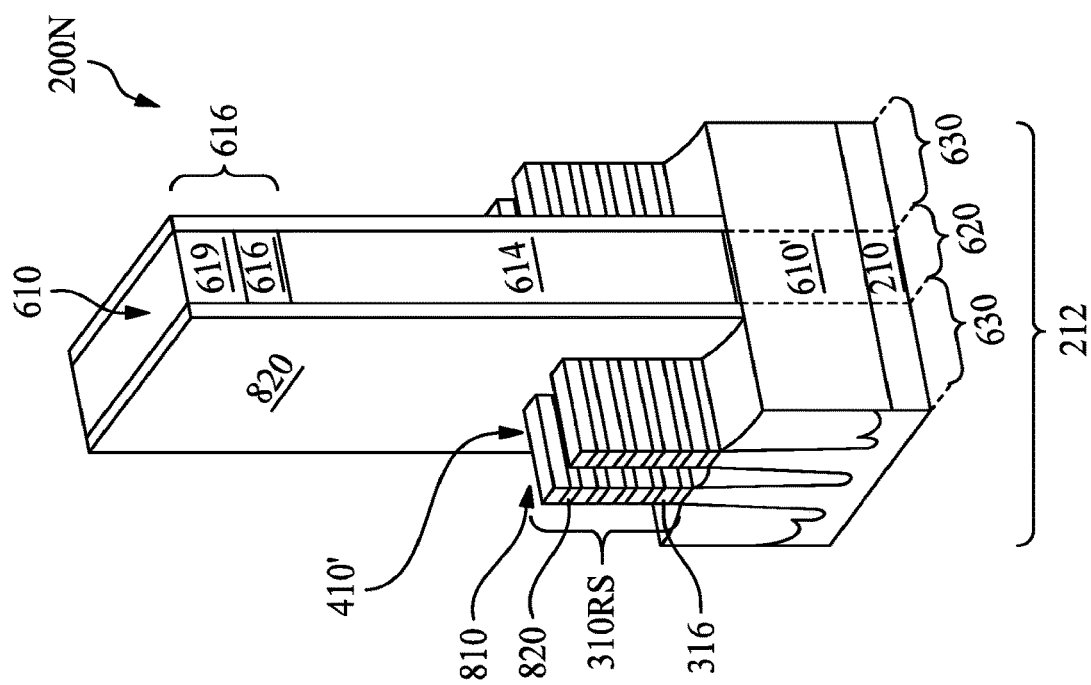

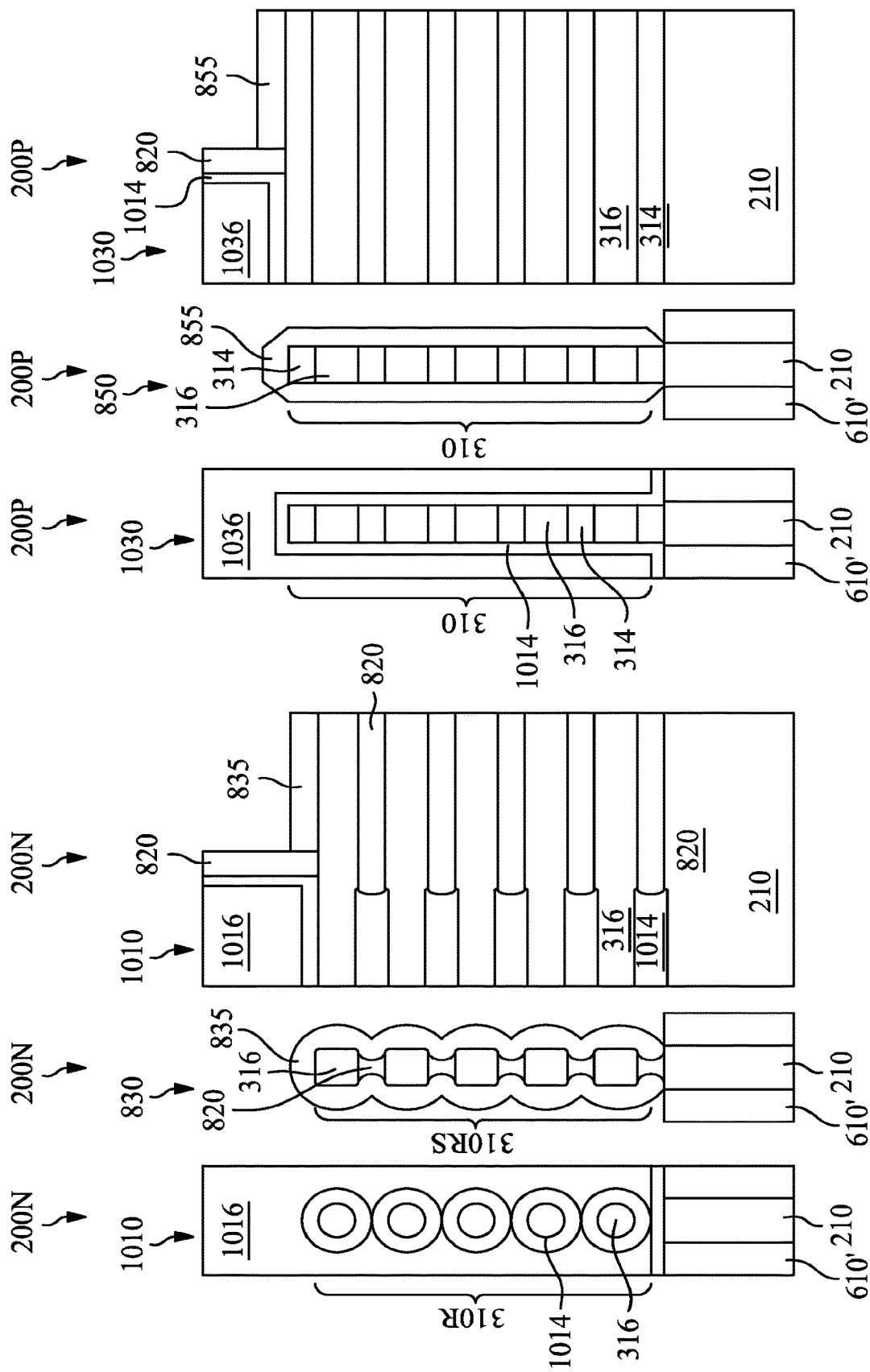

MULTI-GATE DEVICE AND METHOD OF FABRICATION THEREOF

PRIORITY DATA

The present application is a divisional application of U.S. application Ser. No. 14/941,745, filed Nov. 16, 2015, which is incorporated herein by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. Although existing methods of fabricating GAA devices have been generally adequate for their intended purposes, they have not been entirely satisfactory in all respects. For example, challenges still rise in maintaining gate control and mitigating SCEs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9A, 9B, 9C, 9D, 10A, 10B, 11A, 11B, 12A, 12B, 13A, 13B, 14A, 14B, 15A, 15B, 16A, 16B, 17A and 17B are isometric views of an embodiment of a device 200 according to aspects of the method of FIG. 1.

FIG. 18A is a cross-section views, corresponding to the isometric view of FIG. 17A along line A-A, of an embodiment of the device 200 according to aspects of the method of FIG. 1.

FIG. 18B is a cross-section views, corresponding to the isometric view of FIG. 17A along line B-B, of an embodiment of the device 200 according to aspects of the method of FIG. 1.

FIG. 18C is a cross-section views, corresponding to the isometric view of FIG. 17A along line C-C, of an embodiment of the device 200 according to aspects of the method of FIG. 1.

FIG. 19A is a cross-section views, corresponding to the isometric view of FIG. 17B along line A-A, of an embodiment of the device 200 according to aspects of the method of FIG. 1.

FIG. 19B is a cross-section views, corresponding to the isometric view of FIG. 17B along line B-B, of an embodiment of the device 200 according to aspects of the method of FIG. 1.

FIG. 19C is a cross-section views, corresponding to the isometric view of FIG. 17B along line C-C, of an embodiment of the device 200 according to aspects of the method of FIG. 1.

DETAILED DESCRIPTION

Figure 1:
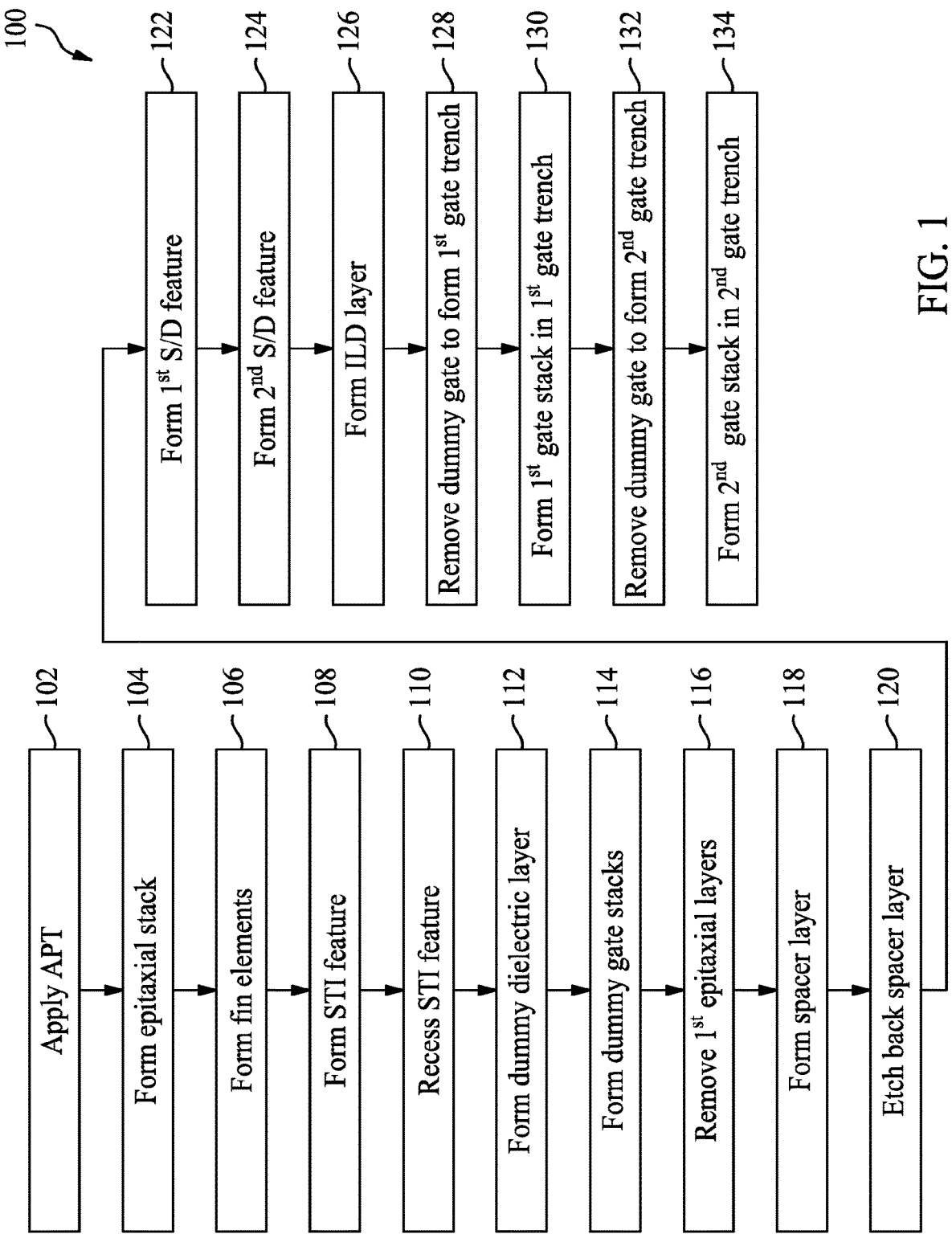
FIG. 1 is a flow chart of a method of fabricating a multi-gate device or portion provided according to one or more aspects of the present disclosure and including an isolation region under the gate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teachings described herein apply to a single channel (e.g., single nanowire) and/or any number of channels.

FIG. 1 is a method 100 of semiconductor fabrication including fabrication of multi-gate devices. Multi-gate device refers to a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region in a GAA device may be referred to as a "nanowire," which includes channel regions of various geometries (e.g., cylindrical, bar-shaped) and various dimensions.

FIGS. 2 through 17B are isometric views of an embodiment of a semiconductor device 200 according to various stages of method 100 of FIG. 1. FIGS. 18A through 19C are cross-section views, corresponding to respective isometric views listed above, of an embodiment of the semiconductor device 200 according to various stages of method 100 of FIG. 1. As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including P-type field-effect transistor (PFETs), N-type field-effect transistors (NFETs), etc., which may be interconnected. Moreover, it is noted that the process steps of method 100, including any descriptions given with reference to the figures, as with the remainder of the method and exemplary figures provided in this disclosure, are merely exemplary and are not intended to be limiting beyond what is specifically recited in the claims that follow.

Figure 2:
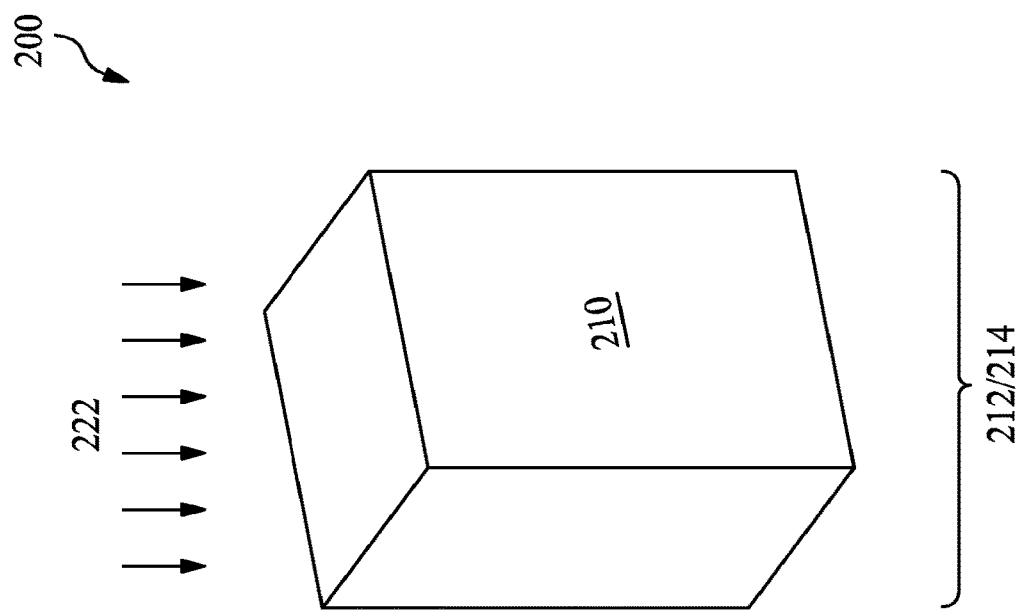

Referring to FIGS. 1 and 2, method 100 begins at step 102 by applying an anti-punch through (APT) implant 222 to a substrate 210. In the present embodiment, based on device performance considerations, the substrate 200 includes a first region 212 and a separate second region 214. In some embodiments, the first region 212 may include a NFET region and the second region 214 may include a PFET region. For simplicity, FIGS. 2-8 of the disclosed method illustrate method 100 being performed on both first region 212 and second region 214 as indicated by the drawing.

In some embodiments, the substrate 210 may be a semiconductor substrate such as a silicon substrate. The substrate 210 may include various layers, including conductive or insulating layers formed on a semiconductor substrate. The substrate 210 may include various doping configurations depending on design requirements. For example, different doping profiles (e.g., n wells, p wells) may be formed on the substrate 210 in regions designed for different device types (e.g., n-type field effect transistors (NFET), p-type field effect transistors (PFET)). The suitable doping may include ion implantation of dopants and/or diffusion processes. The substrate 210 typically has isolation features (e.g., shallow trench isolation (STI) features) interposing the regions providing different device types. The substrate 210 may also include other semiconductors such as germanium, silicon carbide (SiC), silicon germanium (SiGe), or diamond. Alternatively, the substrate 210 may include a compound semi-conductor and/or an alloy semiconductor. Further, the substrate 210 may optionally include an epitaxial layer (epi-layer), may be strained for performance enhancement, may include a silicon-on-insulator (SOI) structure, and/or have other suitable enhancement features.

The APT implant 222 may be performed in a region underlying the channel region of a device for example, to prevent punch-through or unwanted diffusion. In some embodiments, a first photolithography (photo) step is performed to pattern a P-type APT region and a second photo step is performed to pattern an N-type APT region. For example, in some embodiments, performing the first photo step may include forming a photoresist layer (resist) over the substrate 210, exposing the resist to a pattern (e.g., P-type APT implant mask), performing post-exposure bake processes, and developing the resist to form a patterned resist layer. By way of example, a P-type dopant implanted via the ion implantation process to form the P-type APT region may include boron, aluminum, gallium, indium, and/or other P-type acceptor material. Thereafter, in some embodiments, the second photo step may be performed, where the second photo step may include forming a resist layer over the substrate 210, exposing the resist to a pattern (e.g., N-type APT implant mask), performing post-exposure bake processes, and developing the resist to form a patterned resist layer. By way of example, an N-type dopant implanted via the ion implantation process into the N-type APT region may include arsenic, phosphorous, antimony, or other N-type donor material. Additionally, in various embodiments, an APT implant may have a high dopant concentration, for example, of between about $1\times10^{18}$ cm$^{-3}$ and $1\times10^{19}$ cm$^{-3}$. In some embodiments, such a high APT dopant concentration may be advantageously used, as described below, because of the presence of a subsequently formed isolation layer over the APT-implanted substrate, which can serve as a dopant diffusion barrier.

Figure 3:
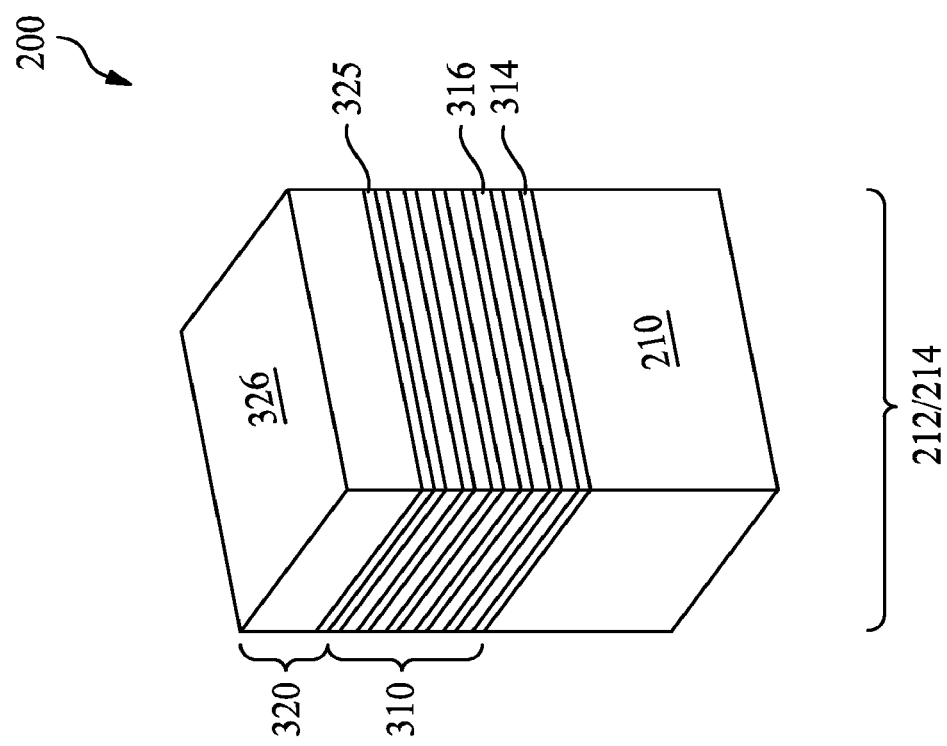

Referring to FIGS. 1 and 3, method 100 proceeds to step 104 by forming an epitaxial stack 310 over the APT-implanted substrate 210, including in the NFET region 212 and the PFET region 214. The epitaxial stack 310 includes first epitaxial layers 314 of a first composition interposed by second epitaxial layers 316 of a second composition. The first and second compositions may be different or may be the same. In an embodiment, the first epitaxial layers 314 are formed of SiGe and the second epitaxial layers 316 are formed of silicon. However, other embodiments are possible including those that provide for a first composition and a second composition having different oxidation rates. In some embodiments, the first epitaxial layer 314 includes SiGe and where the second epitaxial layer 316 includes Si.

The second epitaxial layers 316 or portions thereof may form a channel region of the multi-gate device 200. For example, the second epitaxial layers 316 may be referred to as "nanowires" used to form a channel region of a multi-gate device 200 such as a GAA device. These "nanowires" are also used to form a portion of the source/drain features of the multi-gate device 200 as discussed below. The use of the second epitaxial layers 316 to define a channel or channels of a device is further discussed below. It is noted that the second epitaxial layer 316 (nanowire) is formed over both of the NFET region 212 and the PFET region 214, which provides process simplicity for manufacturing the device 200.

It is noted that six (6) layers of first epitaxial layers 314 and five (5) layers of the second epitaxial layers 316 are illustrated in FIG. 3. This is for illustrative purposes only and not intended to be limiting. It can be appreciated that any number of epitaxial layers can be formed in the epitaxial stack 310, the number of layers depending on the desired number of channels regions for the device 200. In some embodiments, the number of second epitaxial layers 316 is between 2 and 10. In some embodiments, a topmost epitaxial layer of the epitaxial stack 310 is the first epitaxial layer 314. As a result, total number of the first epitaxial layers 314 is one layer more than a total number the second epitaxial layers 316.

As described in more detail below, in the NFET region 212, each of the second epitaxial layers 316 may serve as a first channel region(s) for a subsequently gate-all-around device and its thickness chosen based on device performance considerations. The first epitaxial layer 314 may serve to define a gap distance between adjacent first channel region(s) for a subsequently-gate-all-around device and its thickness chosen based on device performance considerations. Additionally, in the PFET region 214, each of the first epitaxial layers 314 may also serve as a first channel region(s) for a subsequently-gate-stack device and its thickness chosen based on device performance considerations. The second epitaxial layer 316 may also serve to define a distance between adjacent second channel region(s) for a subsequently-gate-stack device and its thickness chosen based on device performance considerations. In some embodiments, a thickness of the second epitaxial layer 316 is greater than a thickness of the first epitaxial layer 314. For example, a ratio of a thickness of the second epitaxial layer 316 to a thickness of the first epitaxial layer 314 is in a range of 1.1 to 2. In an embodiment, the first epitaxial layer 314 has a thickness range of about 2 nanometers (nm) to about 6 nm and the second epitaxial layer 316 has a thickness range of about 3 nm to about 11 nm. The first and second epitaxial layers, 314 and 316, may be substantially uniform in thickness.

By way of example, epitaxial growth of the layers of the epitaxial stack 310 may be performed by a molecular beam epitaxial (MBE) process, a metalorganic chemical vapor deposition (MOCVD) process, and/or other suitable epitaxial growth processes. In some embodiments, the epitaxially grown layers such as, the second epitaxial layers 316 include the same material as the substrate 210. In some embodiments, the first and second epitaxially grown layers, 314 and 316, include a different material than the substrate 210. As stated above, in at least some examples, the first epitaxial layer 314 includes an epitaxially grown silicon germanium (SiGe) layer and the second epitaxial layer 316 includes epitaxially grown silicon (Si) layer. Alternatively, in some embodiments, either of the first and second epitaxial layers, 314 and 316, may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the first and second epitaxial layers, 314 and 316, may be chosen based on providing differing oxidation, etch selectivity properties. In various embodiments, the first and second epitaxial layers, 314 and 316, are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

As also shown in the example of FIG. 3, a hard mask (HM) layer 320 may be formed over the epitaxial stack 310. In some embodiments, the HM layer 320 includes an oxide layer 325 (e.g., a pad oxide layer that may include $SiO_2$) and nitride layer 326 (e.g., a pad nitride layer that may include $Si_3N_4$) formed over the oxide layer 325. In some examples, the HM layer 320 includes thermally grown oxide, chemical vapor deposition (CVD)-deposited oxide, and/or atomic layer deposition (ALD)-deposited oxide. In some embodiments, the HM layer 320 includes a nitride layer deposited by CVD and/or other suitable technique. The HM layer 320 may be used to protect portions of the substrate 210 and/or epitaxial stack 310 and/or used to define a pattern (e.g., fin elements) as discussed below.

Figure 4:
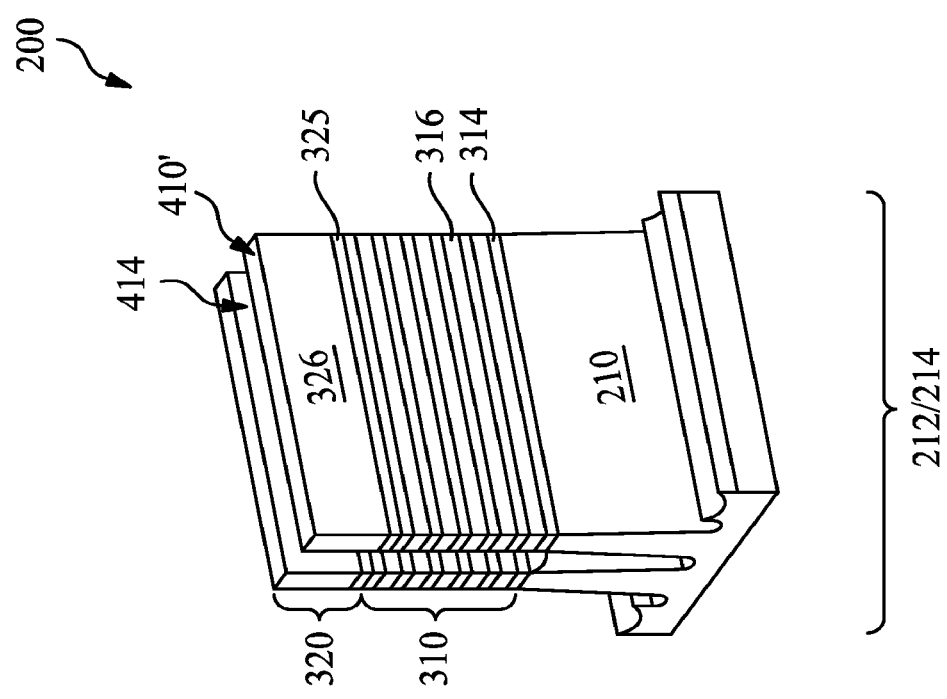

Referring to FIGS. 1 and 4, method 100 proceeds to step 106 by forming a plurality of fin elements 410 (referred to as fins) extending from the substrate 210, in both the NFET region 212 and the PFET region 214. In various embodiments, each of the fins 410 includes a substrate portion formed from the substrate 210, portions of each of the epitaxial layers of the epitaxial stack including epitaxial layers 314 and 316, and an HM layer portion from the HM layer 320.

The fins 410 may be fabricated using suitable processes including photolithography and etch processes. The photolithography process may include forming a photoresist layer over the substrate 210 (e.g., over the HM layer 320 of FIG. 3), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 210, and layers formed thereupon, while an etch process forms trenches 414 in unprotected regions through the HM layer 320, through the epitaxial stack 310, and into the substrate 210, thereby leaving the plurality of extending fins 410. The trenches 414 may be etched using a dry etch (e.g., reactive ion etching), a wet etch, and/or combination thereof.

Numerous other embodiments of methods to form the fins on the substrate 210 may also be used including, for example, defining the fin region (e.g., by mask or isolation regions) and epitaxially growing the epitaxial stack 310 in the form of the fin 410. In some embodiments, forming the fins 410 may include a trim process to decrease the width of the fins 410. The trim process may include wet and/or dry etching processes.

Figure 5:
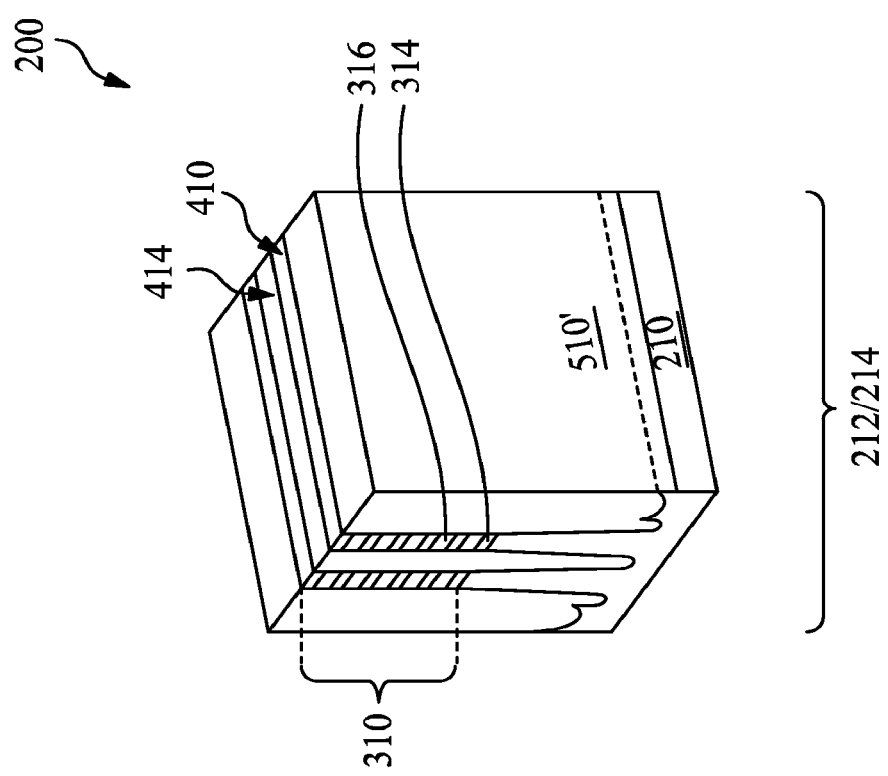

Referring to FIGS. 1 and 5, method 100 proceeds to step 108 by forming shallow trench isolation (STI) features 510 between the fins 410 in both the NFET region 212 and the PFET region 214. By way of example, in some embodiments, a dielectric layer is first deposited over the substrate 210, filling the trenches 414 with the dielectric material. In some embodiments, the dielectric layer may include $SiO_2$, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 510) may include a multi-layer structure, for example, having one or more liner layers.

In forming the STI features 510, after deposition of the dielectric layer, the deposited dielectric material is thinned and planarized, for example by a chemical mechanical polishing (CMP) process. The CMP process may planarize the top surface of the dielectric layer. In some embodiments, the CMP process used to planarize the top surface of the device 200 may also serve to remove the HM layer 320 from each of the plurality of fins 410. In some embodiments, removal of the HM layer 320 may alternately be performed by using a suitable etching process (e.g., dry or wet etching).

Figure 6:
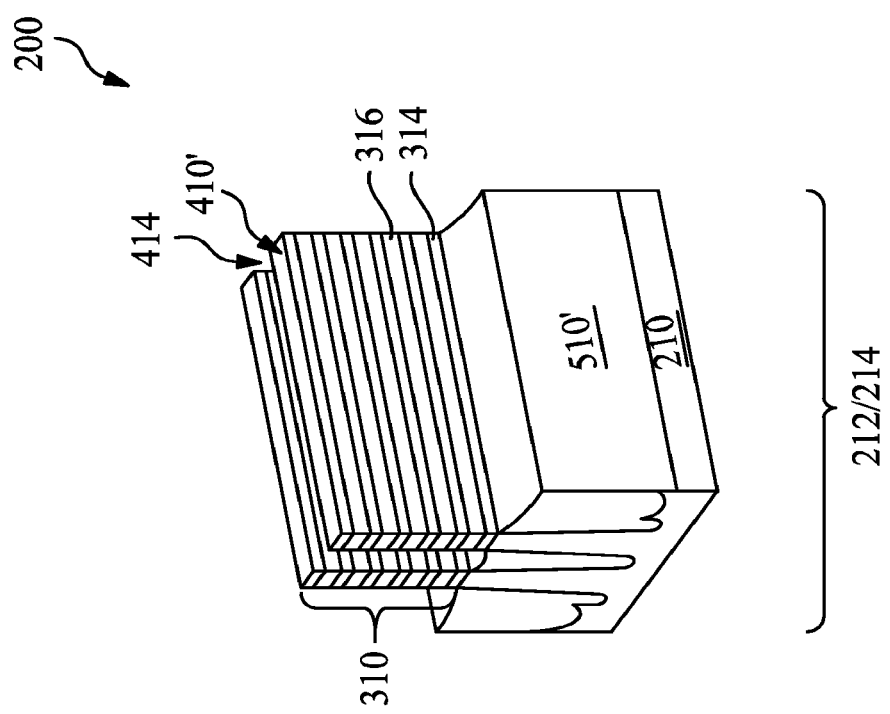

Referring to FIGS. 1 and 6, method 100 proceeds to step 110 by recessing the STI features 510, referred to as 510', in the NFET region 212 and the PFET region 214. The STI features 510' interpose the fins 410 to provide the fins 410 extending above the recessed STI features 510'. In some embodiments, the recessing process may include a dry etching process, a wet etching process, and/or a combination thereof. In some embodiments, a recessing depth is controlled (e.g., by controlling an etching time) so as to result in a desired height of an upper portion of the fins 410 is exposed, referred to as 410'. In some embodiments, the fins 410' include each of the layers of the epitaxial stack 310.

Figure 7:
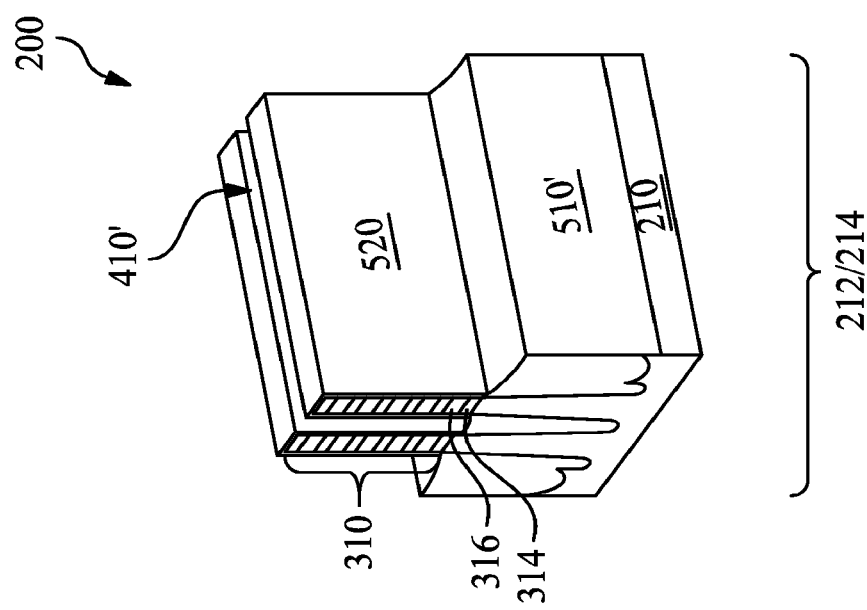

Referring to FIGS. 1 and 7, method 100 proceeds to step 112 by forming a dummy dielectric layer 520 over the fins 410' in the NFET region 212 and the PFET region 214. In some embodiments, the dummy dielectric layer 520 may include $SiO_2$, silicon nitride, a high-K dielectric material and/or other suitable material. In various examples, the dummy dielectric layer 520 may be deposited by a CVD process, a subatmospheric CVD (SACVD) process, a flowable CVD process, an ALD process, a PVD process, or other suitable process. By way of example, the dummy dielectric layer 520 may be used to prevent damage to the fins 410' by subsequent processing (e.g., subsequent formation of the dummy gate stack).

Figure 8:
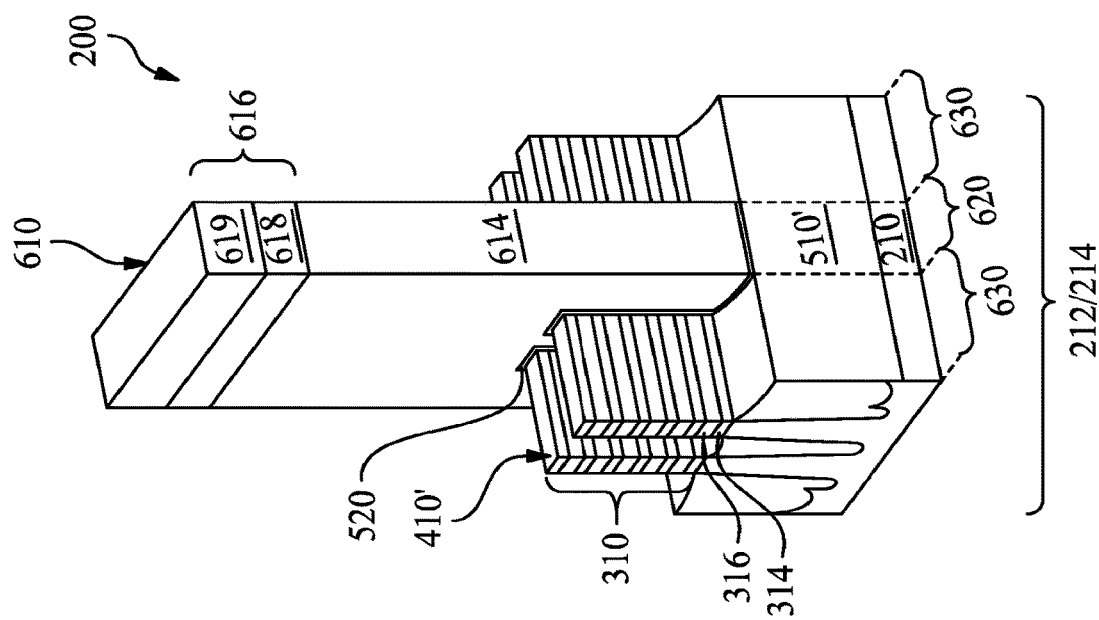

Referring to FIGS. 1 and 8, method 100 proceeds to step 114 by forming a gate stack 610 in the NFET region 212 and the PFET region 214. In an embodiment, the gate stack 610 is a dummy (sacrificial) gate stack and will be replaced by the final gate stack at a subsequent processing stage of the device 200. In particular, the dummy gate stack 610 may be replaced at a later processing stage by a high-K dielectric layer (HK) and metal gate electrode (MG) as discussed below. In some embodiments, the dummy gate stack 610 is formed over the substrate 210 and is at least partially disposed over the fins 410'. The portion of the fins 410' underlying the dummy gate stack 610 may be referred to as a channel region 620. The dummy gate stack 610 may also define a source/drain (S/D) region 630 of the fins 410', for example, the regions of the fin 410' adjacent and on opposing sides of the channel region 620.

In some embodiments, the dummy gate stack 610 includes the dummy dielectric layer 520, an electrode layer 614, and a gate hard mask 616 which may include multiple layers 618 and 619 (e.g., an oxide layer 618 and a nitride layer 619). In some embodiments, the dummy dielectric layer 520 is not included in the dummy gate stack 610, for example, being removed prior to the deposition of the dummy gate stack 610. In some embodiments, an additional dummy gate dielectric layer is included in the gate stack in addition or in lieu of dummy dielectric layer 520. In some embodiments, the dummy gate stack 610 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the dummy gate stack 610 may include an additional gate dielectric layer. For example, the dummy gate stack 610 may include silicon oxide. Alternatively or additionally, the gate dielectric layer of the dummy gate stack 610 may include silicon nitride, a high-K dielectric material or other suitable material. In some embodiments, the electrode layer 614 may include polycrystalline silicon (polysilicon). In some embodiments, the gate hard mask 616 includes an oxide layer 618 such as a pad oxide layer that may include $SiO_2$. In some embodiments, the gate hard mask 616 includes the nitride layer 619 such as a pad nitride layer that may include $Si_3N_4$, silicon oxynitride and/or silicon carbide.

Referring again to FIG. 8, in some embodiments, after formation of the dummy gate 610, the dummy dielectric layer 520 is removed from the exposed regions of the substrate 210 including fins 410' not covered by the dummy gate 610. The etch process may include a wet etch, a dry etch, and/or a combination thereof.

As discussed above, FIGS. 2-8 of the disclosed method illustrate method 100 being performed on both NFET region 212 and PFET region 214. Beginning with FIG. 9A below, the present disclosure illustrates the distinct process steps occurring separately in NFET region 212 to form device 200N and PFET region 214 to form device 214P.

Figure 9B:
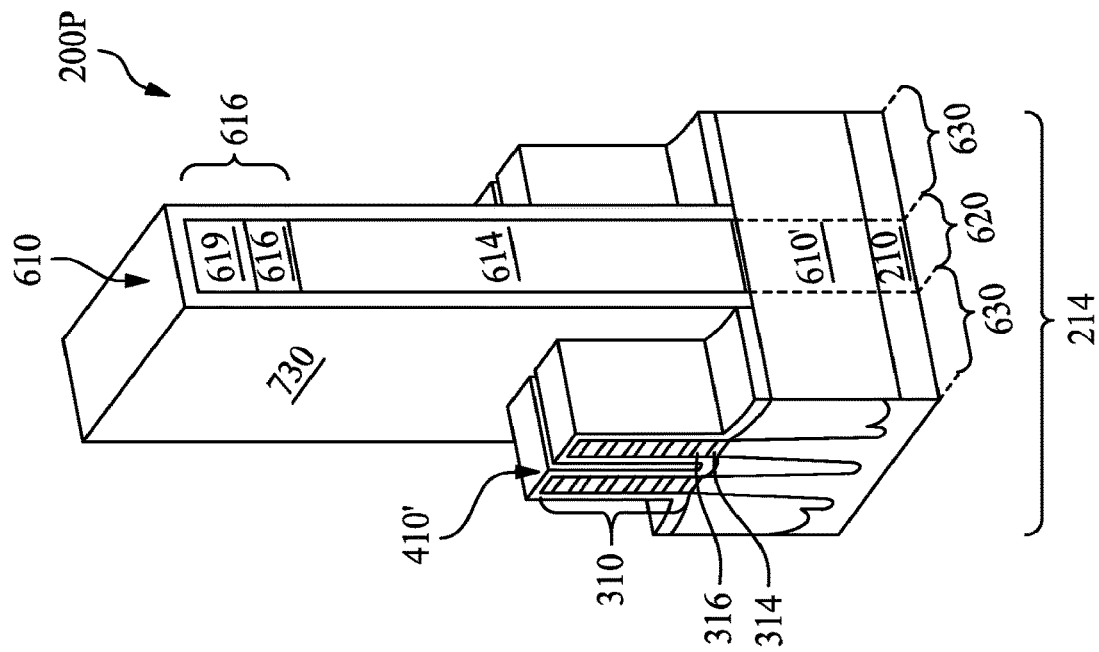
Figure 9A:
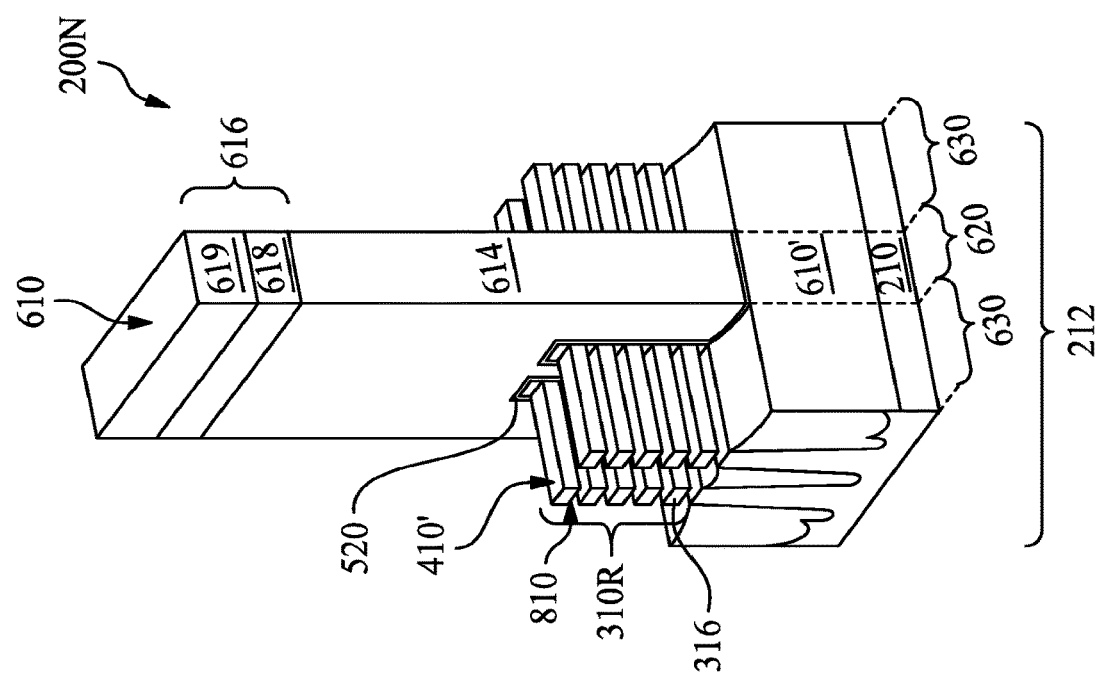

Referring to FIGS. 1, 9A and 9B, method 100 proceeds to step 116 by removing the first epitaxial layers 314 in the S/D region 630 in the NFET region 212 while covering the PFET region 214 with a first patterned HM 730. In some embodiments, prior to removing the first epitaxial layers 314 in the NFET region 212, the first patterned HM 730 is formed to cover the PFET region 214. The first patterned HM 730 may include a patterned photoresist layer and formed by a by a lithography process. Alternatively, the first patterned HM 730 may be formed by depositing a HM layer, forming a patterned photoresist layer over the HM layer by a lithography process and etching the HM material layer through the patterned photoresist layer to form the first patterned HM 730.

In the present embodiment, after forming the patterned HM 730, the first epitaxial layers 314 of the epitaxial stack 310 are removed from the S/D region 630 in the NFET region 212. For the sake of clarity, after removing the first epitaxial layers 314, the epitaxial stack 310 is referred to as 310R. FIG. 9A illustrates gaps 810 in the place of the epitaxial layers 314 (FIG. 8). The gaps 810 may be filled with the ambient environment (e.g., air, $N_2$). In an embodiment, the first epitaxial layers 314 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. In an embodiment, the first epitaxial layers 314 are SiGe and the second epitaxial layers 316 are silicon allowing for the selective removal of the first epitaxial layers 314.

Figure 9D:
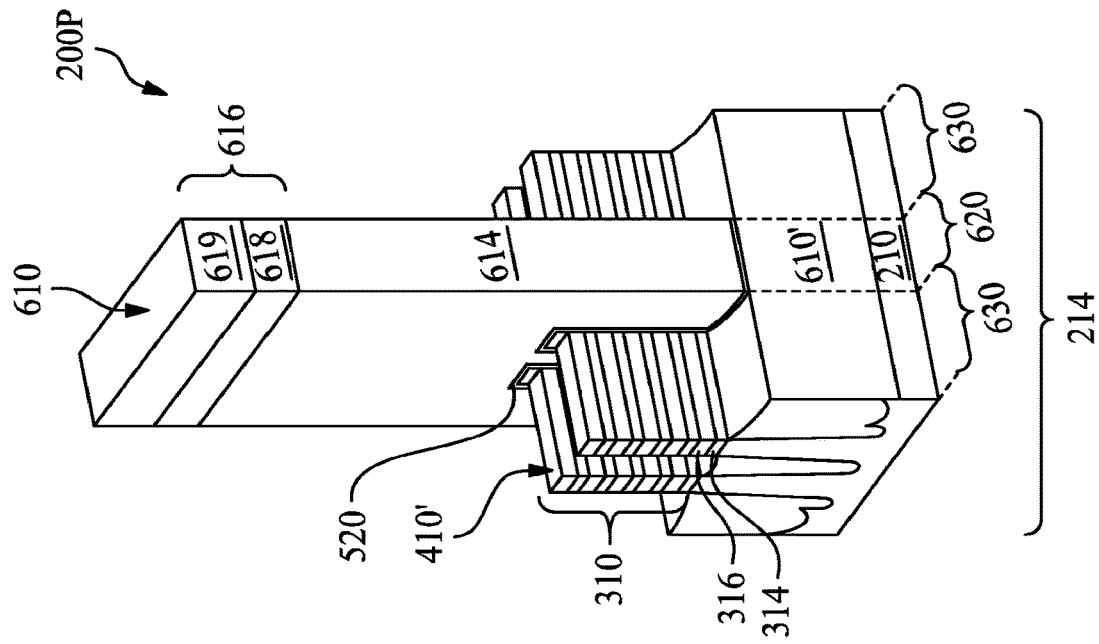
Figure 9C:
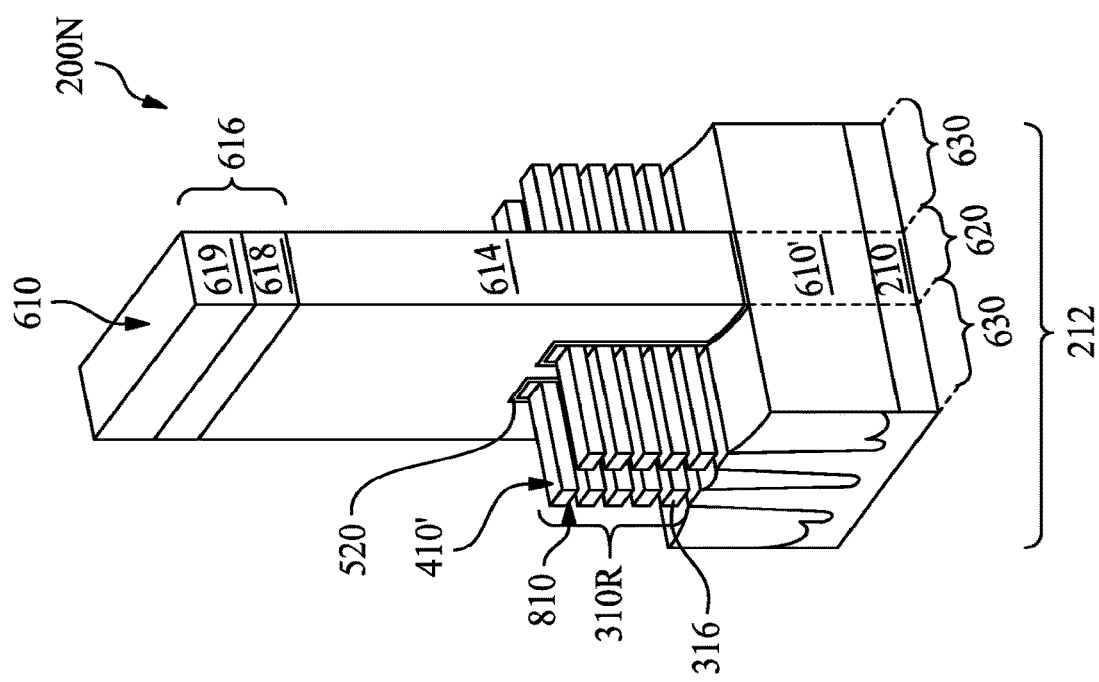

After removing the first epitaxial layers 314 in the NFET region 212, the first patterned HM 730 is removed by an etch process, as shown in FIGS. 9C and 9D. In one example where the first patterned HM 730 is a photoresist pattern, the first patterned HM 730 is removed by wet stripping and/or plasma ashing.

Referring to FIGS. 1 and 10A-10B, method 100 proceeds to step 118 by forming a spacer layer 820 over the NFET region 212 and the PFET region 214. The spacer layer 820 may be a conformal dielectric layer formed over the NFET region 212 and the PFET region 214. The spacer layer 820 may form spacer elements on the sidewalls of the dummy gate stack 610. The spacer layer 820 may also fill the gaps 810 provided by the removal of the epitaxial layers described in step 116 above. For the sake of clarity, after filling the gaps 810 with the spacer layer 820, the epitaxial stack 310R is referred to as 310RS.

The spacer layer 820 may include a dielectric material such as silicon oxide, silicon nitride, silicon carbide, silicon oxynitride, SiCN films, silicon oxycarbide, SiOCN films, and/or combinations thereof. In some embodiments, the spacer layer 820 includes multiple layers, such as main spacer walls, liner layers, and the like. By way of example, the spacer layer 820 may be formed by depositing a dielectric material over the dummy gate stack 610 using processes such as, CVD process, a subatmospheric CVD (SACVD) process, a flowable CVD process, an ALD process, a PVD process, or other suitable process. In certain embodiments, the deposition may be followed by an etching back (e.g., anisotropically) the dielectric material.

Referring again to FIGS. 1, 10A and 10B, method 100 proceeds to step 120 by etching-back the spacer layer 820 in the NFET region 212 and the PFET region 214. In the present embodiment, the spacer layer 820 is etched back to expose portions of the fins 410' in S/D regions 630. The spacer layer 820 may remain on the sidewalls of the dummy gate structure 610 forming spacer elements while it is removed from a top surface of the dummy gate stack 610. In some embodiments, etching-back of the spacer layer 820 may include a wet etch process, a dry etch process, a multiple-step etch process, and/or a combination thereof. In the NFET region 212, while the spacer layer 820 being removed from a top surface and the lateral surfaces of the exposed epitaxial stack 310RS, as illustrated in FIG. 10A, the spacer layer 820 remains interposing and disposed below the second epitaxial layer 316 of the epitaxial stack 310RS in the S/D region 630. The spacer layer disposed below the second epitaxial layer 316 (e.g., nanowire). In the PFET region 214, the spacer layer 820 is removed from exposed epitaxial stack 310 in the S/D region 630, as shown in FIG. 10B.

Figure 11B:
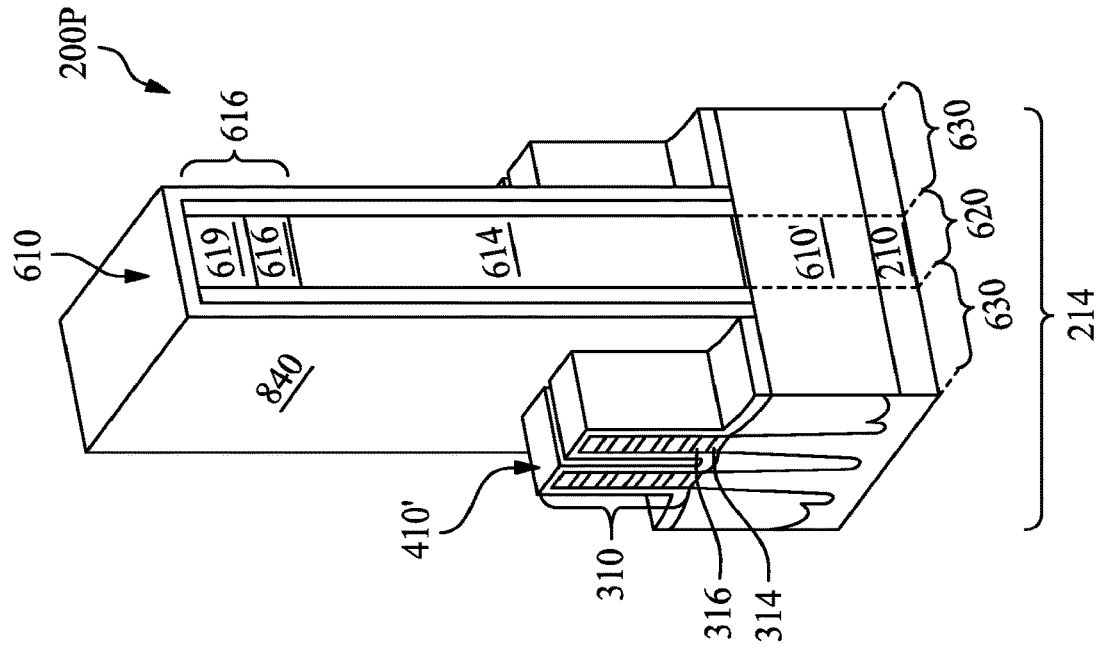
Figure 11A:
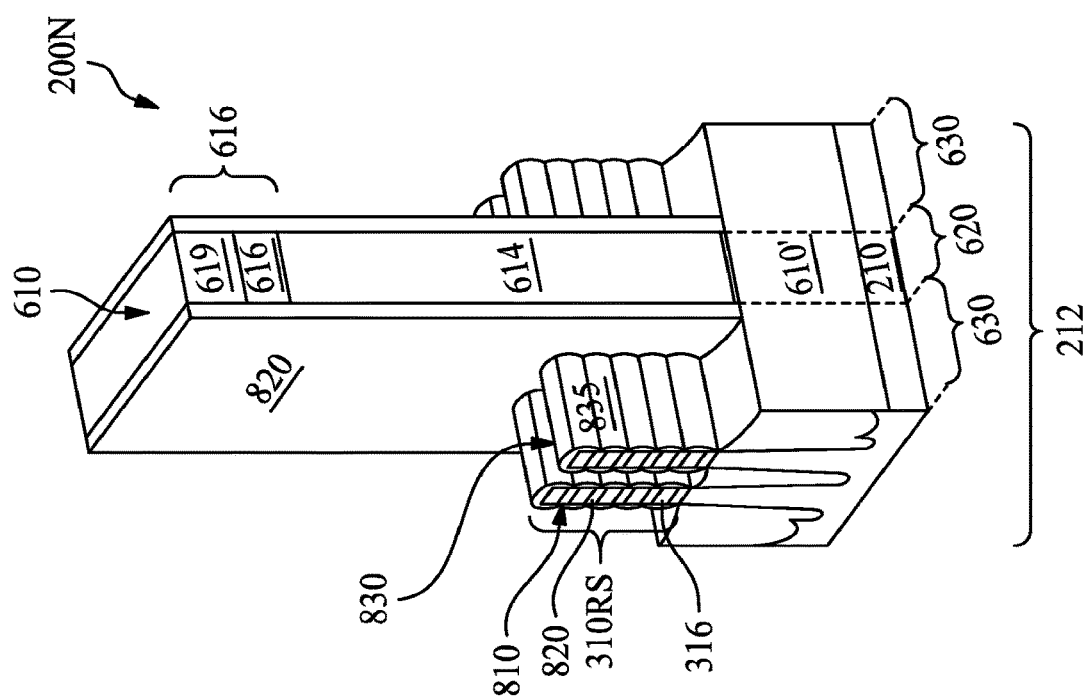

Referring to FIGS. 1, 11A and 11B, method 100 proceeds to step 122 by forming a first source/drain (S/D) feature 830 in the NFET region 212, while covering the PFET region 214 with a second patterned HM 840. The second patterned HM 840 is forming similarly in many respects to the first patterned HM 730 discussed above association with FIG. 9B, including the materials discussed therein.

In the NFET region 212, the first S/D features 830 may be formed by performing an epitaxial growth process that provides an epitaxial material cladding the epitaxial stack 310RS in the S/D region 630. In some embodiments, the first S/D features 830 are formed by epitaxially growing a semiconductor material 835 on the second epitaxial layer 316. In other words, the epitaxially grown semiconductor material 835 is formed around nanowires 316, this may be referred to as forming a "cladding" around the nanowire 316.

In various embodiments, the epitaxially grown semiconductor material 835 may include Ge, Si, GaAs, AlGaAs, SiGe, GaAsP, SiP, and/or other suitable material. In some embodiments, the epitaxially grown semiconductor material 835 may be in-situ doped during the epi process. In some embodiments, the epitaxially grown semiconductor material 835 is not in-situ doped, and, for example, instead an implantation process is performed to dope the epitaxially grown semiconductor material 835.

Thus, the first S/D features 830 associated with the dummy gate stack 610 include the second epitaxial layers 316 and the epitaxially grown material 835. Dielectric material from the spacer layer 820 interposes the second epitaxial layer 316. Each of the epitaxial layer 316 (e.g., nanowires) extends into the channel region 620, thereby forming a multi-channel, multi-S/D region device. In an embodiment, in the NFET region 212, the first S/D feature 830 clads over five nanowires 316 and extends into the channel region 620. After forming the first S/D features 830 in the NFET region 212, the second patterned HM 840 is removed by an etch process.

Figure 12B:
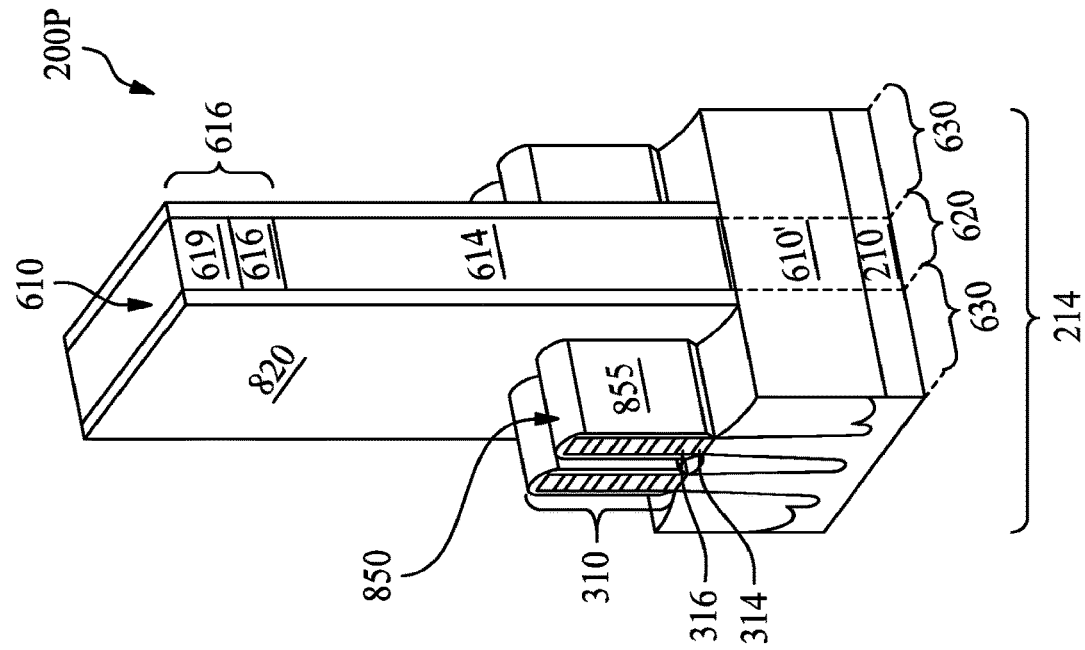
Figure 12A:
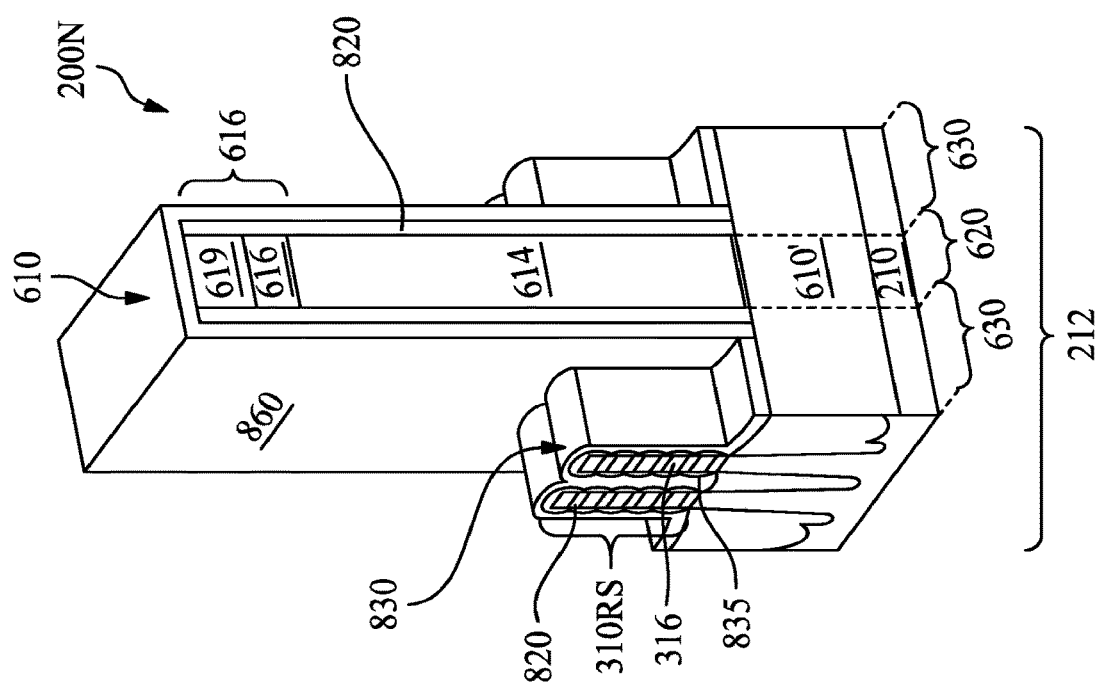

Referring to FIGS. 1, 12A and 12B, method 100 proceeds to step 124 by forming a second source/drain (S/D) feature 850 in the S/D region 630 of the PFET region 214, while covering the NFET region 212 with a third patterned HM 860. The third patterned HM 860 is forming similarly in many respects to the first patterned HM 730 discussed above association with FIG. 9B, including the materials discussed therein.

The second S/D feature 850 may be formed by performing an epitaxial growth process that provides an epitaxial material cladding the epitaxial stack 310. In some embodiments, the second S/D feature 850 is formed by epitaxially growing a semiconductor material 855 over the epitaxial stack 310 having the first epitaxial layer 314 interposing the second epitaxial layer 316. Thus, the second S/D feature 850 associated with the dummy gate stack 610 includes the epitaxial stack 310 and the epitaxially grown material 835 and extends into the channel region 620, thereby forming a single-epitaxial-stack S/D region device. In some embodiments, the second S/D feature 850 are formed similarly in many respects to the first S/D features 830 discussed above association with FIG. 11A, including the materials discussed therein. In some embodiment, the semiconductor material 855 is a different material than the semiconductor material 835. After forming the second S/D features 850 in the PFET region 214, the third patterned HM 860 is removed by an etch process.

Figure 13B:
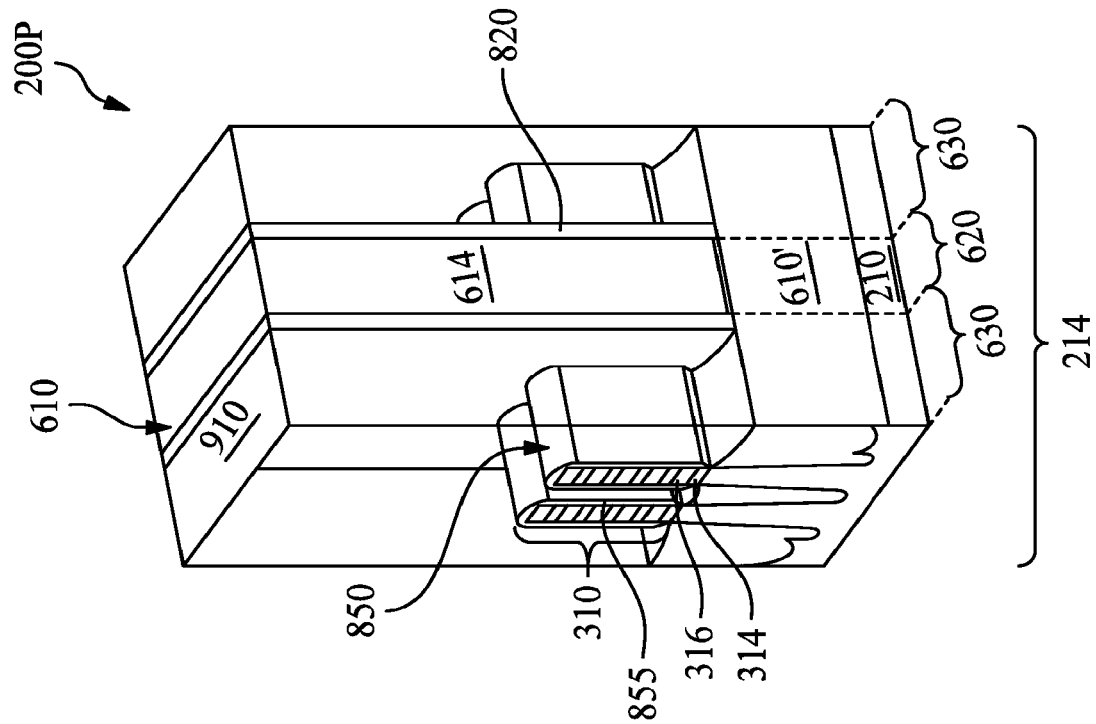
Figure 13A:
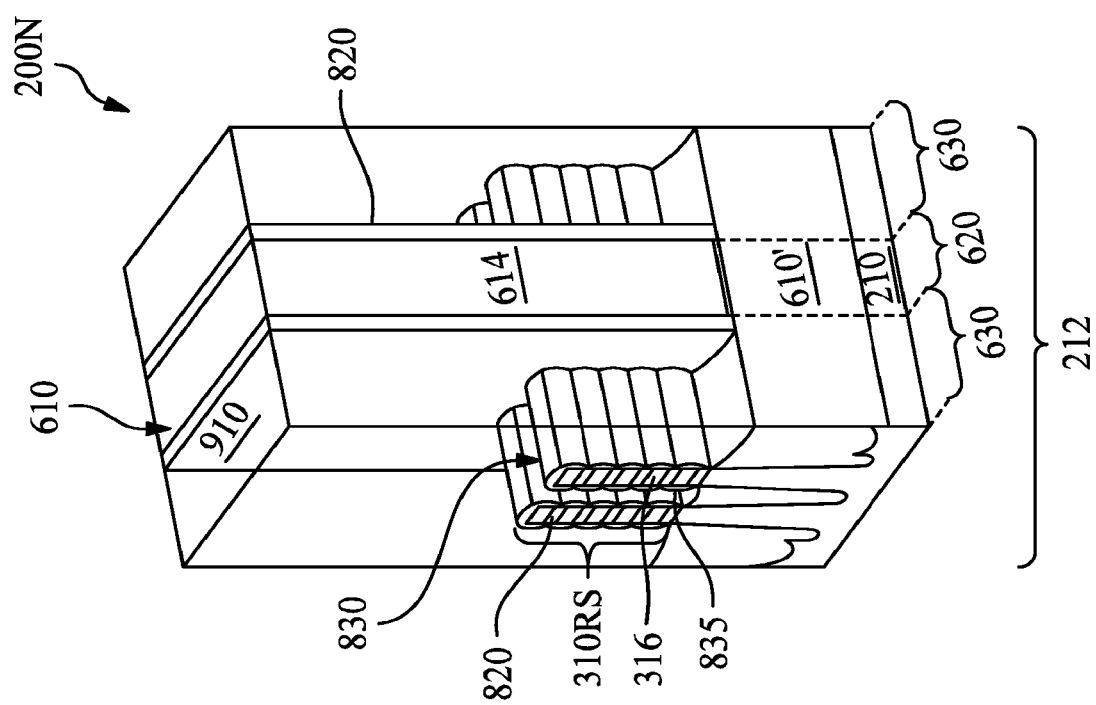

Referring to FIGS. 1, 13A and 13B, method 100 proceeds to step 126 by forming an inter-layer dielectric (ILD) layer 910 over the NFET region 212 and the PFET region 214. In some embodiments, the ILD layer 910 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 910 may be deposited by a PECVD process or other suitable deposition technique.

In some examples, after depositing the ILD layer 910, a planarization process may be performed to expose a top surface of the dummy gate stack 610. For example, a planarization process includes a CMP process which removes portions of the ILD layer 910 overlying the dummy gate stack 610 and planarizes a top surface of the semiconductor device 200. In addition, the CMP process may remove the gate hard mask 616 overlying the dummy gate stack 610 to expose the electrode layer 614, such as a polysilicon electrode layer. Thereafter, in some embodiments, the remaining previously formed dummy gate stack 610 is removed from the substrate 210. In some embodiments, the electrode layer 614 may be removed while the dummy dielectric layer 520 is not removed.

Figure 14A:
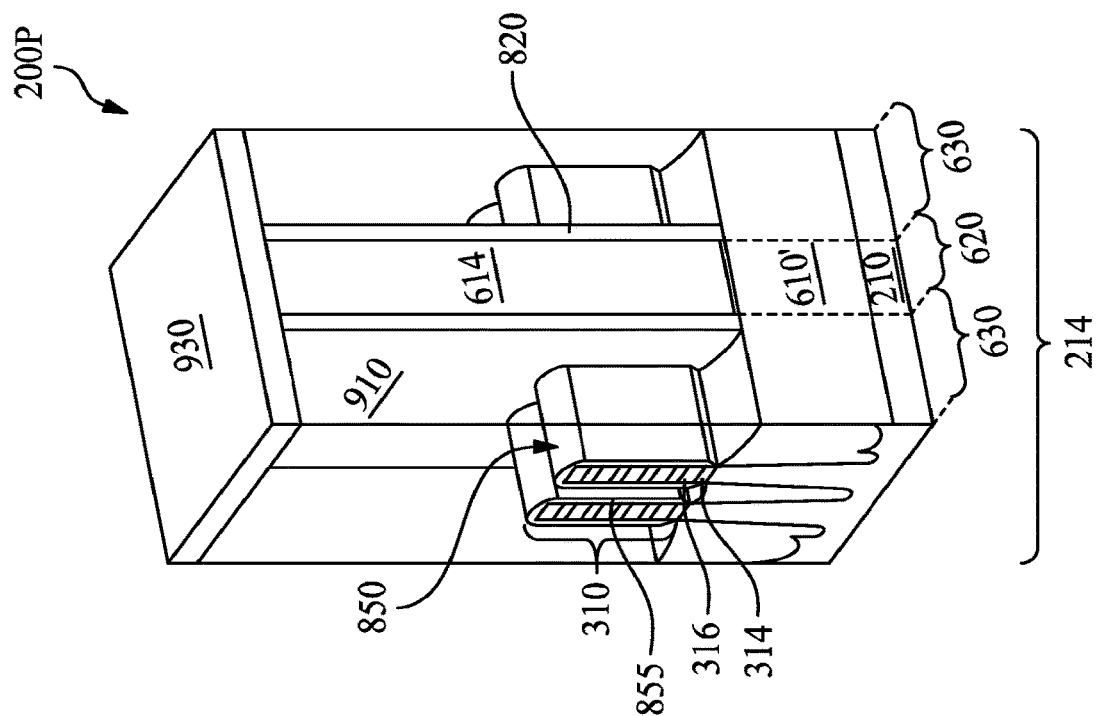
Figure 14B:
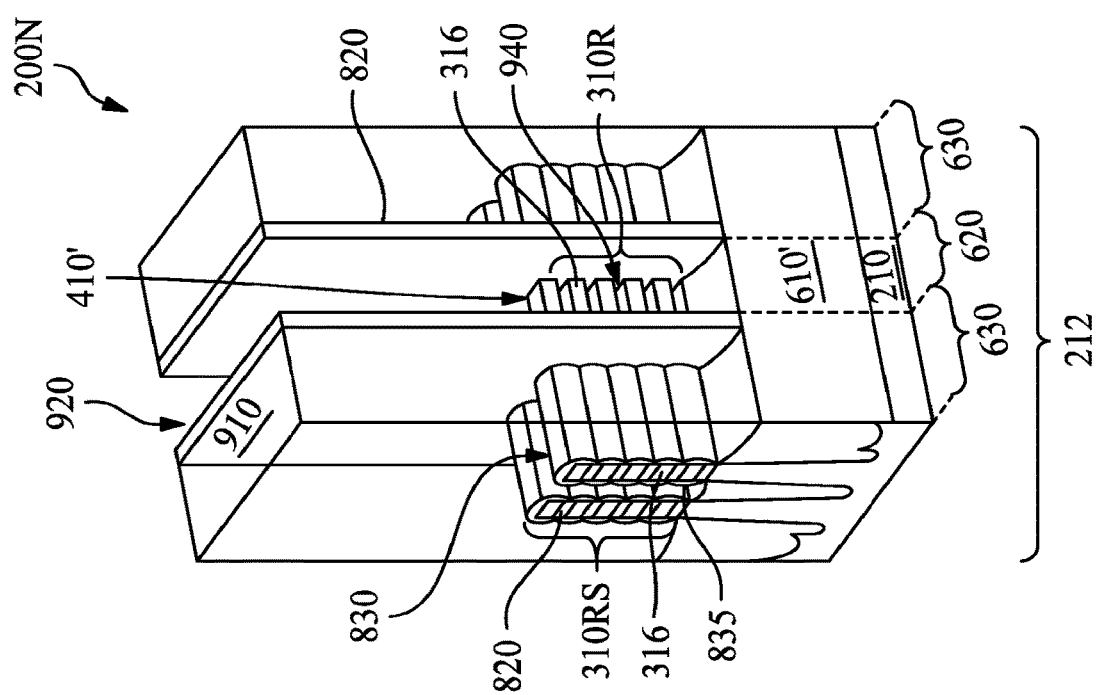

Referring to FIGS. 1, 14A and 14B, method 100 proceeds to step 128 by removing dummy electrode layer 614, the dummy dielectric layer 520 and the first epitaxial layer 314 to form a first gate trench 920 in the channel region 620 of the NFET region 212, while covering the PFET region 214 with a fourth patterned HM 930. The fourth patterned HM 930 is formed similarly in many respects to the first patterned HM 730 discussed above association with FIG. 9B, including the materials discussed therein.

The dummy electrode layer 614 may be removed by using a selective etch process such as a selective wet etch, a selective dry etch, or a combination thereof. The dummy dielectric layer 520 is removed similarly in many respects to the etching process discussed above association with FIG. 8. The first epitaxial layer 314 is removed similarly in many respects to the etching process discussed above association with FIG. 9A. FIG. 14A illustrates gaps 940 in the place of the first epitaxial layers 314 in the channel region 620. The gaps 940 may be filled with the ambient environment (e.g., air, $N_2$). By removing the first epitaxial layers 314, the epitaxial stack 310 in the channel region 620 is transferred to the epitaxial stack 310R and is exposed within the first gate trench 910. The fourth patterned HM 930 is then removed by an etch process. In one example where the fourth patterned HM 930 is a photoresist pattern, the fourth patterned HM 930 is removed by wet stripping and/or plasma ashing.

Figure 15B:
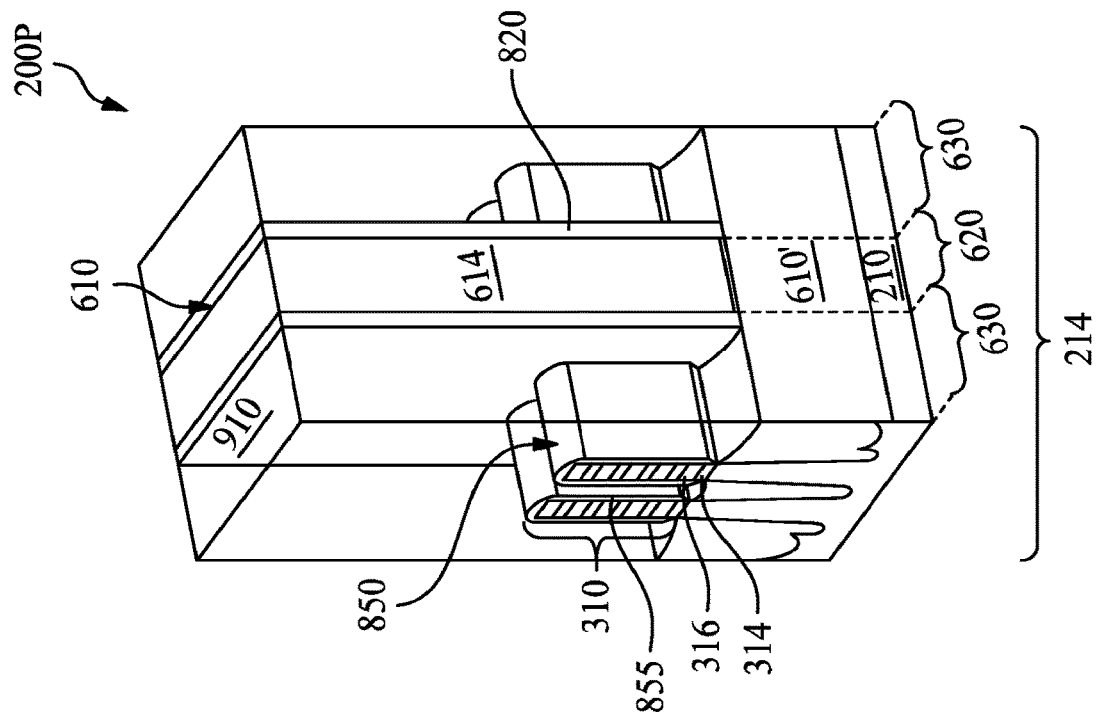
Figure 15A:
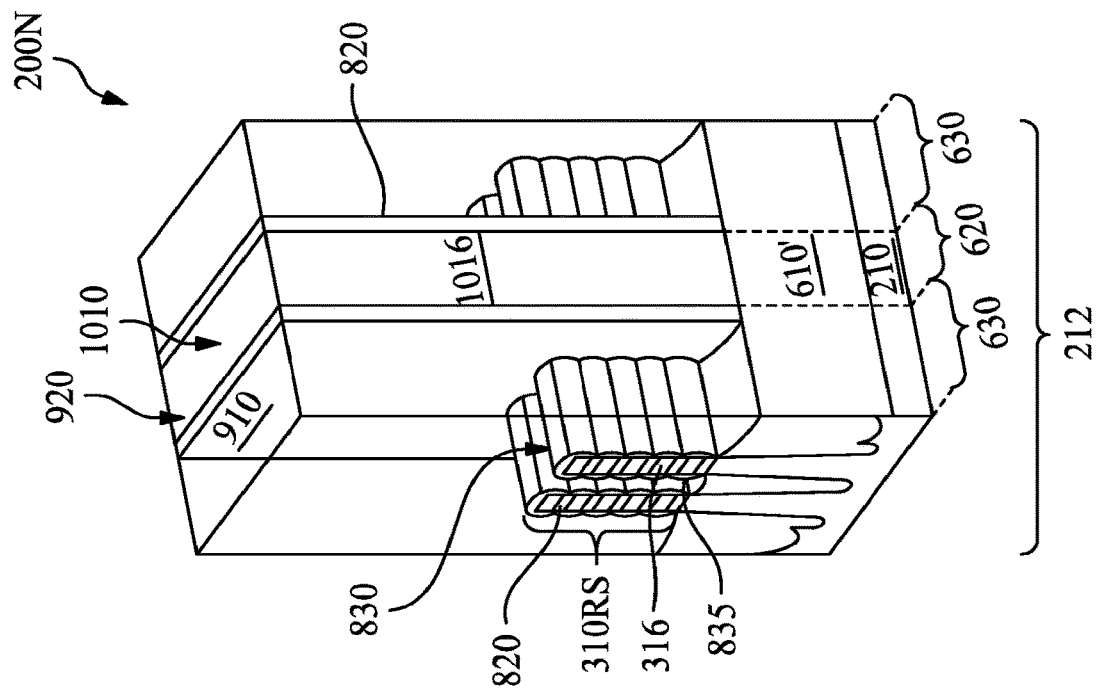

Referring to FIGS. 1, 15A and 15B, method 100 proceeds to step 130 by forming first final gate stack 1010 within the first gate trench 920. The first final gate stack 1010 may be a high-K/metal gate stack, however other compositions are possible. In the present embodiment, the first final gate stack 1010 forms the gate associated with the multi-channels provided by the plurality of the second epitaxial layers 316 (nanowires) in the channel region 620, which is referred to as a gate-all-around (GAA) device. In the present embodiment, first high-K/metal gate (HK/MG) structures 1010 are formed within the first gate trenches 920. In various embodiments, the first HK/MG stack 1010 includes an interfacial layer, a high-K gate dielectric layer 1014 formed over the interfacial layer, and/or a first gate metal layer 1016 formed over the high-K gate dielectric layer 1014. High-K gate dielectrics, as used and described herein, include dielectric materials having a high dielectric constant, for example, greater than that of thermal silicon oxide (~3.9).

In some embodiments, the interfacial layer of the HK/MG stack 1010 may include a dielectric material such as silicon oxide ($SiO_2$), HfSiO, or silicon oxynitride (SiON). The interfacial layer may be formed by chemical oxidation, thermal oxidation, ALD, CVD, and/or other suitable method. The gate dielectric layer 1014 of the HK/MG stack 1010 may include a high-K dielectric layer such as hafnium oxide ($HfO_2$). Alternatively, the gate dielectric layer 1014 of the HK/MG stack 1010 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1014 may be formed by ALD, PVD, CVD, oxidation, and/or other suitable methods. The high-K gate dielectric layer 1014 is formed over the PFET region 214 as well, which will be removed later.

The first gate metal layer 1016 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the first gate metal layer 1016 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the first gate metal layer 1016 may be formed by ALD, PVD, CVD, e-beam evaporation, or other suitable process. In some embodiments, the gate dielectric layer 1014 and the first gate metal layer 1016 are formed over the PFET region 214 as well, which will be removed later.

In various embodiments, a CMP process may be performed to remove the high-K gate dielectric layer 1014 and first gate metal layer 1016 in the PFET region 214 and excessive high-K gate dielectric layer 1014 and first gate metal layer 1016 in the NFET region 212 hereby provide a substantially planar top surface of the device 200.

Figure 16B:
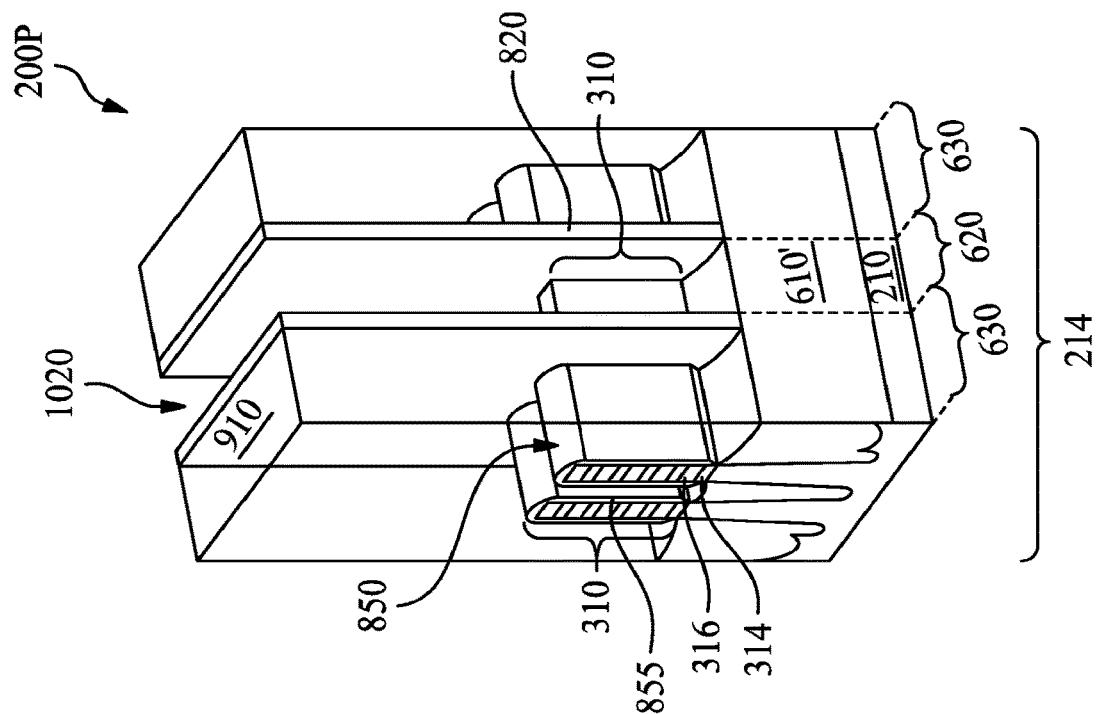
Figure 16A:
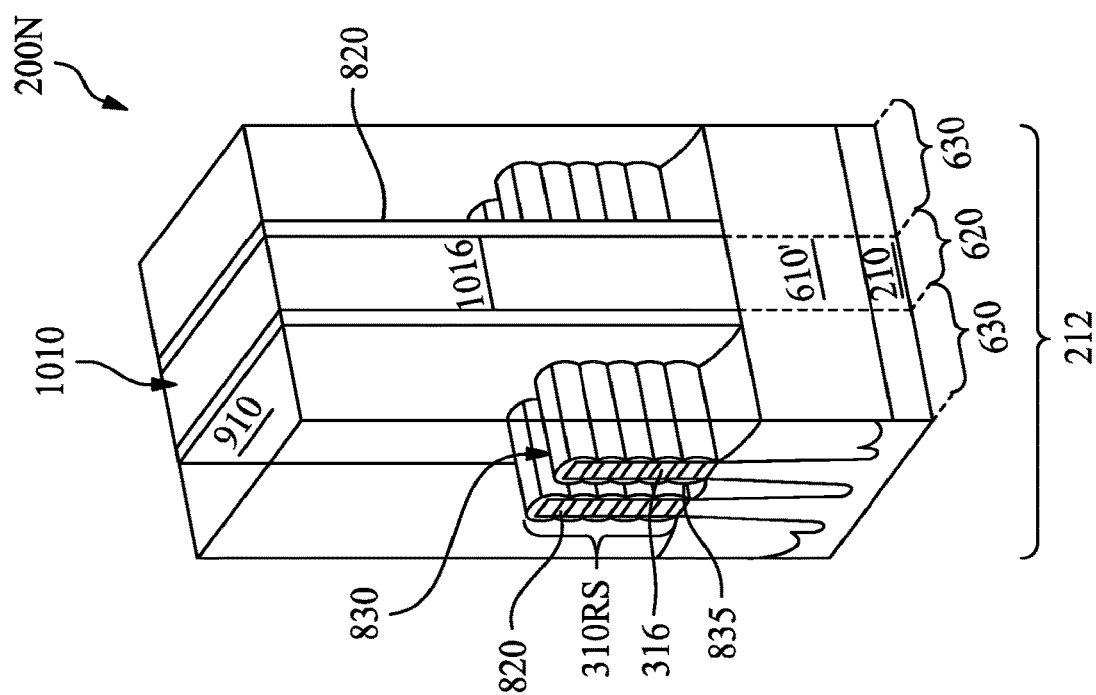

Referring to FIGS. 1, 16A and 16B, method 100 proceeds to step 132 by removing the dummy electrode layer 614 and the dummy dielectric layer 520 to form a second gate trench 1020 in the channel region 620 in the PFET region 214. As a result, the epitaxial stack 310 is exposed within the second gate trench 1020. The etch process may include a wet etch, a dry etch, and/or a combination thereof. In some embodiments, the etch process is chosen to selectively etch dummy electrode layer 614 and the dummy dielectric layer 520 without substantially etching the spacer layer 820, the ILD layer 910 and the first final gate stack 1010. Thus, the second gate trench 1020 is formed with a self-alignment nature, which relaxes process constrains.

Figure 17B:
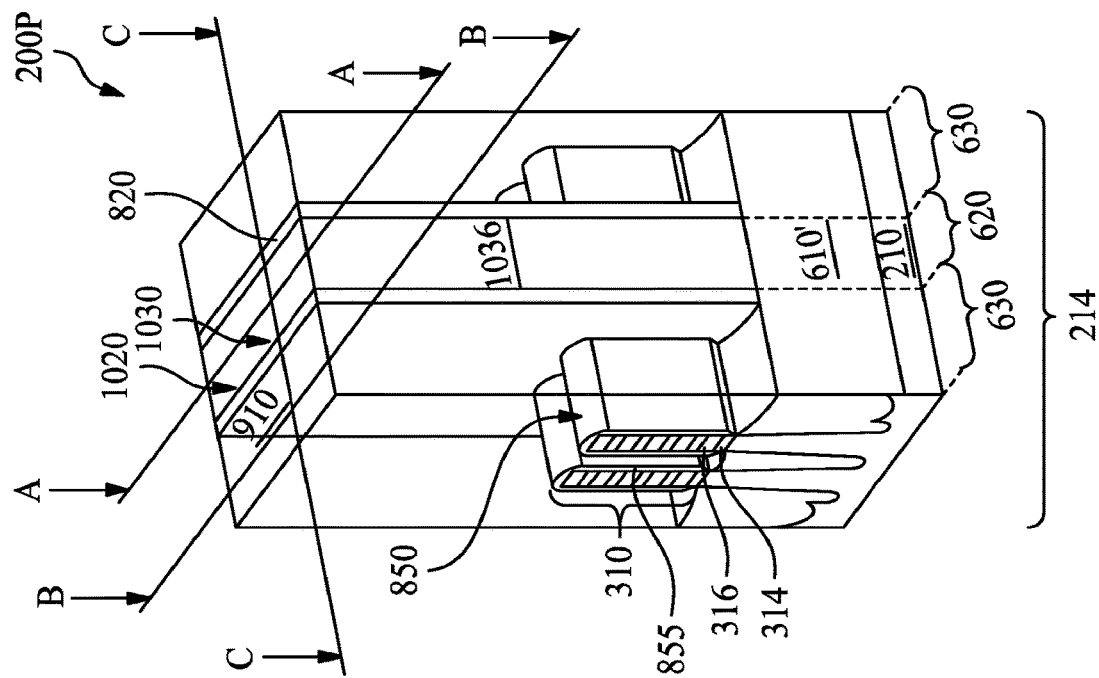
Figure 17A:
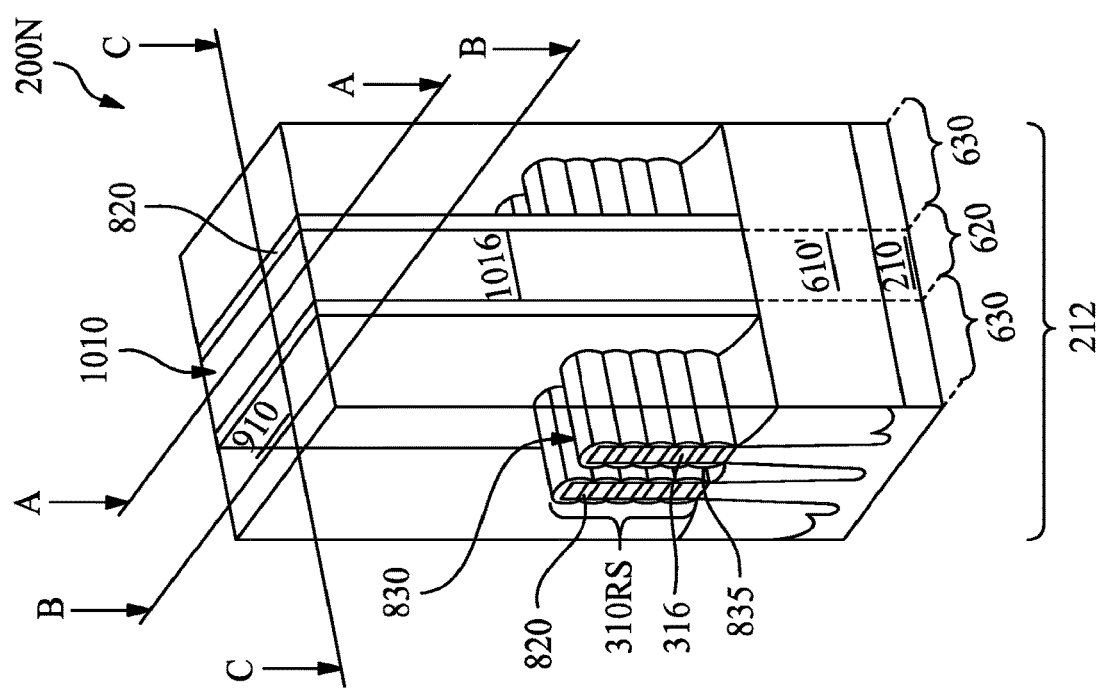

Referring to FIGS. 1, 17A and 17B, method 100 proceeds to step 134 by forming a second final gate stack 1030 over the epitaxial stack 310 within the second gate trench 1020 to form a single epitaxial-stack gate. The second final gate stack 1030 may be a HK/MG gate stack, however other compositions are possible. In some embodiments, the second final gate stack 1030 forms the gate associated with the epitaxial stack 310 having the plurality of first epitaxial layers 314 as multiple gate channels, separated by the plurality of second epitaxial layers 316 to introduce an efficient strain to the gate channels to improve device performance.

In various embodiments, the second HK/MG stack 1030 includes the interfacial layer, the high-K gate dielectric layer 1014 formed over the interfacial layer, and/or a second gate metal layer 1036 formed over the high-K gate dielectric layer 1014. The second HK/MG stack 1030 may be formed similarly in many respects to the first HK/MG stack 1010 discussed above association with FIG. 15A, including the materials discussed therein. The second gate metal layer 1036 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the second gate metal layer 1036 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the second gate metal layer 1036 may be formed by ALD, PVD, CVD, e-beam evaporation, or other suitable process.

In various embodiments, a CMP process may be performed to remove the high-K gate dielectric layer 1014 and second gate metal layer 1036 in the NFET region 212 and excessive high-K gate dielectric layer 1014 and second gate metal layer 1036 in the PFET region 214 to provide a substantially planar top surface of the device 200.

As evident by method 100, device 200N performs with a gate-all-around (GAA) in NFET region and device 200P is a single epitaxial-stack gate in PFET region. The device 200N is illustrated in isometric view in FIG. 17A and corresponding cross-sectional views in FIG. 18A (cross-sectional along line A-A through the first final gate stack 1010), FIG. 18B (cross-sectional along line B-B through the first S/D feature 830) and FIG. 18C (cross-sectional along line C-C through the channel region 620 and S/D region 630). The multi-gate device 200P is illustrated in isometric view in FIG. 17B and corresponding cross-sectional views in FIG. 19A (cross-sectional along line A-A through the second final gate stack 1030), FIG. 19B (cross-sectional along line B-B through the second S/D feature 850) and FIG. 19C (cross-sectional along line C-C through the channel region 620 and S/D region 630).

In the NFET region 212, as illustrated in FIGS. 18A and 18C, the gate dielectric layer 1014 is disposed below the second epitaxial layer 316 (e.g., nanowire). However, in other embodiments, other portions of the first HK/MG stack 1010 (e.g., first gate metal layer 1016) may also be disposed under the second epitaxial layer 316. In some embodiments, the device 200 may be a FinFET device having a gate formed on at least two-sides of the channel region 620 (e.g., top and two sidewalls). In the present embodiment, the device 200 is formed with an all-round gate in the NFET region 212. As having been mentioned previously, in the present embodiment, the thickness of the second epitaxial layer 316 (a diameter of the nanowire) is chosen to be greater than the first epitaxial layer 314 to enhance gate current for the NFET. The device 200 in FIGS. 18B and 18C illustrate the first S/D feature 830 having the epitaxially grown cladding layer 835 disposed on multiple surfaces of the second epitaxial layer 316 (e.g., nanowire), while spacer layer 820 is disposed between second epitaxial layers 316. The spacer layer 820 contacts to the gate dielectric layer 1014 in the channel region 620. The first S/D feature 830 is formed over the epitaxial stack 310RS having multiple nanowires and each of the nanowire (the second epitaxial material 316) extends into the channel region 620, thereby forming a gate-all-around, multi-source and drain region structure. In some embodiments, a total number of nanowires in S/D region 630 is same as a total number of nanowires in channel region 620.

In the PFET region 214, as illustrated in FIGS. 19A and 19C, the gate dielectric layer 1014 wraps around the epitaxial stack 310, which has the plurality of first epitaxial layers 314 interposed by the plurality of second epitaxial layers 316. In some embodiments, the device 200 may be a FINFET device having a gate formed on at least two-sides of the channel region 620 (e.g., top and two sidewalls) and/or have other configurations. In the present embodiment, the device 200P is formed with a single epitaxial-stack-gate in the PFET region 214. It is noted that the total number of the first epitaxial 314 in the channel region 620 in the PFET region 214 is one number more than the total number of the nanowires (second epitaxial layer 316) in the channel region 620 in the NFET region 212, which is based on PFET performance consideration such as enhance PFET gate current.

The device 200N in FIGS. 19B and 19C illustrate the second S/D feature 850 having the epitaxially grown cladding layer 855 disposed over the epitaxial stack 310. The second S/D feature 850 extends into the channel region 620, thereby forming a single-epitaxial stack gate, single-source and drain region structure.

Additional process steps may be implemented before, during, and after method 100, and some process steps described above may be replaced or eliminated in accordance with various embodiments of method 100.

As an example, the device 200 is formed such that the total number of the first epitaxial 314 in the channel region 620 in the PFET region 214 is same as the total number of the nanowires (second epitaxial layer 316) in the channel region 620 in the NFET region 212. For this purpose, in step 104, instead of the first epitaxial layer 314, the topmost epitaxial layer of the epitaxial stack 310 is the second epitaxial layer 316. And, in step 124, prior to forming the second source/drain (S/D) feature 850 in the S/D region 630 of the PFET region 214, the topmost second epitaxial layer 316 is removed by a selective etch process. Similarly, in step 132, after removing the dummy electrode layer 614 and the dummy dielectric layer 520 to form a second gate trench 1020 in the channel region 620 in the PFET region 214, the topmost second epitaxial layer 316 of the epitaxial stack 310 is removed by another selective etch process.

Based on the above, it can be seen that the present disclosure provides devices and methods of forming devices such that a gate-all-around, multi-source/drain region structure in NFET region and a single epitaxial-stack gate, a single epitaxial-stack source/drain structure in PFET region. With a quite simple and feasible process integration, the device is equipped with more channel layer in the PFET region to enhanced PFET channel current and a greater nanowire diameter in the NFET region to enhance NFET channel current.

The present disclosure provides many different embodiments of a semiconductor device, which includes a first transistor having a first type of conductivity disposed over a semiconductor substrate. The first transistor includes a first epitaxial layer formed of a first semiconductor material, a second epitaxial layer formed of the first semiconductor material and disposed over the first epitaxial layer. The first transistor also includes a first gate dielectric layer surrounds the first and second epitaxial layers and extends from a top surface of the first epitaxial layer to a bottom surface of the second epitaxial layer. The top surface of the first epitaxial layer faces away the semiconductor substrate and the bottom surface of the second epitaxial layer faces the semiconductor substrate. The first transistor also includes a first metal gate layer surrounding the first gate dielectric layer including the first and second epitaxial layers. The device also includes a second transistor having a second type of conductivity disposed over a semiconductor substrate and the second type of conductivity being opposite the first type of conductivity. The second transistor includes a third epitaxial layer formed of the first semiconductor material and a fourth epitaxial layer disposed directly on the third epitaxial layer and formed of a second semiconductor material that is different than the first semiconductor material. The second transistor also includes a second gate dielectric layer disposed over the third and fourth epitaxial layers and a second metal gate layer disposed over the second gate dielectric layer.

In another embodiment, a device includes a N-type field-effect transistor (NFET) disposed over a semiconductor substrate. The NFET includes a plurality of first epitaxial layers formed of a first semiconductor material. The NFET also includes a first gate dielectric layer surrounding each of first epitaxial layer of the plurality of first epitaxial layers and extending from a top surface of one first epitaxial layer to a bottom surface of the next first epitaxial layer. The top surface of the first epitaxial layer faces away the semiconductor substrate and the bottom surface of the second epitaxial layer faces the semiconductor substrate. The NFET also includes a first metal gate layer surrounding the first gate dielectric layer including the plurality of the epitaxial layers and a first sidewall spacer disposed along a sidewall of the first metal gate layer. The device also includes a P-type field-effect transistor (PFET) disposed over the semiconductor substrate. The PFET includes a stack of epitaxial layers, having a plurality of second epitaxial layers formed of a second semiconductor material that is different than the first semiconductor material and an another plurality of the first epitaxial layers. Each of two adjacent second epitaxial layers is interposed by one first epitaxial layer. The first epitaxial layer is disposed directly on the second epitaxial layer. The PFET also includes a second gate dielectric layer disposed directly on sidewalls of the stack of epitaxial layers and a second metal gate layer disposed over the second gate dielectric layer.

In yet another embodiment, a method includes forming a first fin and a second fin in a first region and a second region, respectively, over a substrate. The first fin has a first source/drain region and a first channel region and the second fin has a second source/drain region and a second channel region. Both of the first fin and the second fin are formed of a stack of epitaxial layers that includes first epitaxial layers having a first composition interposed by second epitaxial layers having a second composition. The method also includes removing the second epitaxial layers from a portion the first fin to form first gaps in the first source/drain region, filling the first gaps with the dielectric material, growing a third epitaxial material on at least two surfaces of each of the first epitaxial layers in the first source/drain region to form a first source/drain feature while the dielectric material fills the first gaps. The method also includes growing a fourth epitaxial layer over the second fin in the second source/drain region to form a second source/drain feature, forming a dielectric layer over the first source/drain feature and the second source/drain feature and removing the second epitaxial layers from a portion of the first fin in the first channel region. The method also includes, after removing the second epitaxial layer, forming a first gate stack over the first fin in the first channel region. The first gate stack disposed below the each of first epitaxial layer of the plurality of the first epitaxial layers in a first channel region. The method also includes forming a second gate stack over the second fin in the second channel region. The second gate stack wraps around the second fin in the second channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first transistor having a first type of conductivity disposed over a semiconductor substrate, the first transistor including:
      a first epitaxial layer formed of a first semiconductor material;
      a second epitaxial layer formed of the first semiconductor material and disposed over the first epitaxial layer;
      a first gate dielectric layer surrounding the first and second epitaxial layers, wherein in a channel region of the first transistor a portion of the first gate dielectric layer extends from a top surface of the first epitaxial layer to a bottom surface of the second epitaxial layer, the top surface of the first epitaxial layer facing away from the semiconductor substrate and the bottom surface of the second epitaxial layer facing the semiconductor substrate;
      a first metal gate layer surrounding the first gate dielectric layer, the first epitaxial layer and the second epitaxial layer; and
      a first source/drain feature, the first source/drain feature including:
         a portion of the first epitaxial layer;
         a portion of the second epitaxial layer disposed over the portion of the first epitaxial layer;
         a first sidewall spacer having a curved sidewall surface extending from the portion of the first epitaxial layer to the portion of the second epitaxial layer; and
         a first cladding layer having a curved sidewall surface extending from the portion of the first epitaxial layer to the portion of the second epitaxial layer; and
   a second transistor having a second type of conductivity disposed over the semiconductor substrate, the second type of conductivity being opposite the first type of conductivity, the second transistor including:
      a third epitaxial layer formed of the first semiconductor material;
      a fourth epitaxial layer disposed directly on the third epitaxial layer and formed of a second semiconductor material that is different than the first semiconductor material;
      a second gate dielectric layer disposed over the third and fourth epitaxial layers; and
      a second metal gate layer disposed over the second gate dielectric layer.

2. The device of claim 1, wherein the second gate dielectric layer is disposed directly on sidewalls of the third and fourth epitaxial layers.

3. The device of claim 1, wherein the first transistor further includes another portion of the first sidewall spacer disposed along a sidewall of the first metal gate layer.

4. The device of claim 1, wherein the second transistor further includes a second sidewall spacer disposed along a sidewall of the second metal gate layer.

5. The device of claim 4, wherein the second transistor further includes a second source/drain feature, the second source/drain feature including:
   the third epitaxial layer;
   the fourth epitaxial layer disposed directly on the third epitaxial layer; and a second cladding layer disposed over the third and fourth epitaxial layers.

6. The device of claim 5, wherein the second source/drain feature does not include the second sidewall spacer.

7. The device of claim 1, wherein the first transistor further includes a first fin structure and the first and second epitaxial layers are formed over the first fin structure, wherein the second transistor further includes a second fin structure and the third and fourth epitaxial layers are formed over the second fin structure.

8. The device of claim 1, wherein the first type of conductivity is n-type and the second type of conductivity is p-type.

9. The device of claim 1, wherein:
a thickness of the first epitaxial layer is same as a thickness of the second epitaxial layer,
a thickness of the third epitaxial layer is same as the thickness of the first epitaxial layer,
a thickness ratio of the first epitaxial layer to the fourth epitaxial layer is in a range of about 1.1 to about 2.0.

10. The device of claim 1, wherein the curved sidewall surface of the first sidewall spacer is concave, and
wherein the curved sidewall surface of the first cladding layer is convex.

11. A device comprising:
a N-type field-effect transistor (NFET) disposed over a semiconductor substrate, the NFET including:
a plurality of first epitaxial layers formed of a first semiconductor material;
a first gate dielectric layer surrounding each first epitaxial layer of the plurality of first epitaxial layers, wherein in a channel region of the NFET a portion of the first gate dielectric layer extends from a top surface of one of the first epitaxial layers to a bottom surface of another one of the first epitaxial layers, the top surface of the one of the first epitaxial layers facing away from the semiconductor substrate and the bottom surface of the another one of the first epitaxial layers facing the semiconductor substrate;
a first metal gate layer surrounding the first gate dielectric layer including the plurality of first epitaxial layers;
a first sidewall spacer disposed along a sidewall of the first metal gate layer; and
a first source/drain feature including:
a portion of the plurality of the first epitaxial layers;
a portion of the first sidewall spacer having a curved sidewall surface extending from the one of the first epitaxial layers to the another one of the first epitaxial layers; and
a first cladding layer having a curved sidewall surface extending from the one of the first epitaxial layers to the another one of the first epitaxial layers; and
a P-type field-effect transistor (PFET) disposed over the semiconductor substrate, the PFET including:
a stack of epitaxial layers, having a plurality of second epitaxial layers formed of a second semiconductor material that is different than the first semiconductor material and an another plurality of the first epitaxial layers, wherein each second epitaxial layer is physically contacting at least one first epitaxial layer of the another plurality of the first epitaxial layers;
a second gate dielectric layer disposed directly on sidewalls of the stack of epitaxial layers; and
a second metal gate layer disposed over the second gate dielectric layer.

12. The device of claim 11, wherein the PFET further includes a second source/drain feature, the second source/drain feature including:
the stack of epitaxial layers; and
a second cladding layer disposed over the stack of epitaxial layers.

13. The device of claim 11, wherein a thickness ratio of at least one of the first epitaxial layers to at least one of the second epitaxial layers is in a range of about 1.1 to 2.0.

14. The device of claim 11, wherein a total number of the first epitaxial layers in the NFET is one layer less than a total number of the second epitaxial layers in the PFET.

15. The device of claim 11, wherein a total number of the first epitaxial layers in the NFET is same as a total number of the second epitaxial layers in the PFET.

16. The device of claim 11, wherein the curved sidewall surface of the portion of the first sidewall spacer is concave, and wherein the curved sidewall surface of the first cladding layer is convex.

17. A device comprising:
a first transistor having a first type of conductivity disposed over a semiconductor substrate, the first transistor including:
a first semiconductor layer formed of a first semiconductor material;
a second semiconductor layer formed of the first semiconductor material and disposed over the first semiconductor layer;
a first dielectric layer extending from a bottom surface of the second semiconductor layer to a top surface of the first semiconductor layer, the top surface of the first semiconductor layer facing away the semiconductor substrate and the bottom surface of the second semiconductor layer facing the semiconductor substrate; and
a first source/drain feature that includes:
a portion of the first semiconductor layer having a top surface facing away from the semiconductor substrate;
a portion of the second semiconductor layer having a bottom surface facing the semiconductor substrate;
a second dielectric layer physically contacting each of the top and bottom surfaces and having a curved sidewall surface extending from the top surface of the portion of the first semiconductor layer to the bottom surface of the portion of the second semiconductor layer; and
a first conductive layer physically contacting each of the top and bottom surfaces and having a curved sidewall surface extending from the top surface of the portion of the first semiconductor layer to the bottom surface of the portion of the second semiconductor layer; and
a second transistor having a second type of conductivity disposed over the semiconductor substrate, the second type of conductivity being opposite the first type of conductivity, the second transistor including:
a third semiconductor layer formed of the first semiconductor material; and
a fourth semiconductor layer disposed directly on the third semiconductor layer and formed of a second semiconductor material that is different than the first semiconductor material.

18. The device of claim 17, wherein the third semiconductor layer has a first thickness and the fourth semiconductor layer has a second thickness that is less than the first thickness.

19. The device of claim 17, wherein the second transistor further includes a second source/drain feature, the second source/drain feature including:
- a portion of the third semiconductor layer;
- a portion of the fourth semiconductor layer; and
- a second conductive layer extending from the portion of the third semiconductor layer to the portion of the fourth semiconductor layer.

20. The device of claim 17, wherein the curved sidewall surface of the second dielectric layer is concave, and
   wherein the curved sidewall surface of the first conductive layer is convex.

\* \* \* \* \*